US009953595B2

(12) United States Patent
Miyake et al.

(10) Patent No.: US 9,953,595 B2
(45) Date of Patent: *Apr. 24, 2018

(54) LIQUID CRYSTAL DISPLAY DEVICE AND METHOD FOR DRIVING THE SAME

(71) Applicant: SEMICONDUCTOR ENERGY LABORATORY CO., LTD., Atsugi-shi, Kanagawa-ken (JP)

(72) Inventors: Hiroyuki Miyake, Kanagawa (JP); Yoshiharu Hirakata, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/475,617

(22) Filed: Mar. 31, 2017

(65) Prior Publication Data

US 2017/0294170 A1 Oct. 12, 2017

Related U.S. Application Data

(63) Continuation of application No. 13/936,239, filed on Jul. 8, 2013, now Pat. No. 9,612,496.

(30) Foreign Application Priority Data

Jul. 11, 2012 (JP) ................................ 2012-155318

(51) Int. Cl.
*G02F 1/136* (2006.01)
*G09G 3/36* (2006.01)
(Continued)

(52) U.S. Cl.
CPC ......... *G09G 3/3614* (2013.01); *G02F 1/1368* (2013.01); *G02F 1/133345* (2013.01);
(Continued)

(58) Field of Classification Search
CPC ............. G02F 1/1368; G02F 1/136227; G02F 1/136286; G02F 1/133512;
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

CN 001700293 A 11/2005
EP 1600935 A 11/2005
(Continued)

OTHER PUBLICATIONS

Shishido.H et al., "High Aperture Ratio LCD Display using In—Ga—Zn-Oxide TFTs without Storage Capacitor", SID Digest '10 : SID International Symposium Digest of Technical Papers, 2010, vol. 41, pp. 1128-1131.
(Continued)

*Primary Examiner* — Nathanael R Briggs
*Assistant Examiner* — William Peterson
(74) *Attorney, Agent, or Firm* — Nixon Peabody LLP; Jeffrey L. Costellia

(57) ABSTRACT

A liquid crystal display device whose power consumption is reduced while image quality is prevented from being degraded is provided. Further, a method for driving a liquid crystal display device whose power consumption is reduced while image quality is prevented from being degraded is provided. The liquid crystal display device includes a transistor whose leakage current in an off state is reduced and a liquid crystal element. The capacitance of a pixel satisfies the formula (1) and the formula (2).

19 Claims, 11 Drawing Sheets

(51) Int. Cl.

| | | |
|---|---|---|
| *G02F 1/1362* | (2006.01) | |
| *G02F 1/1335* | (2006.01) | |
| *G02F 1/1368* | (2006.01) | |
| *G02F 1/1343* | (2006.01) | |
| *G02F 1/1333* | (2006.01) | |

(52) U.S. Cl.
CPC .. *G02F 1/133512* (2013.01); *G02F 1/133514* (2013.01); *G02F 1/134309* (2013.01); *G02F 1/136213* (2013.01); *G02F 1/136286* (2013.01); *G09G 3/3648* (2013.01); *G02F 2201/121* (2013.01); *G02F 2201/123* (2013.01); *G02F 2201/40* (2013.01); *G02F 2202/10* (2013.01); *G09G 2330/023* (2013.01)

(58) Field of Classification Search
CPC ......... G02F 1/133514; G02F 1/136213; G02F 1/134309; G02F 1/133345; G02F 2201/123; G02F 2201/121; G02F 2201/40; G02F 2202/10; G09G 3/3614; G09G 3/3648; G09G 2330/023
USPC .......................................................... 349/43
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,015,890 B2 | 3/2006 | Moon |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,088,328 B2 | 8/2006 | Inada et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,619,603 B2 | 11/2009 | Moon |
| 7,646,370 B2 | 1/2010 | Senda et al. |
| 7,674,650 B2 | 3/2010 | Akimoto et al. |
| 7,696,960 B2 | 4/2010 | Senda et al. |
| 7,732,819 B2 | 6/2010 | Akimoto et al. |
| 7,816,682 B2 | 10/2010 | Kimura |
| 8,044,981 B2 | 10/2011 | Chen et al. |
| 8,106,930 B2 | 1/2012 | Wang et al. |
| 8,199,266 B2 | 6/2012 | Su et al. |
| 8,338,865 B2 | 12/2012 | Kimura |
| 8,395,716 B2 | 3/2013 | Ishitani et al. |
| 8,441,589 B2 | 5/2013 | Su et al. |
| 8,482,005 B2 | 7/2013 | Yamazaki et al. |
| 8,698,155 B2 | 4/2014 | Yamazaki et al. |
| 9,612,496 B2 * | 4/2017 | Miyake ................. G02F 1/1368 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0171319 A1 | 7/2007 | Fujita et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0236640 A1 | 10/2007 | Kimura |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0149445 A1 | 6/2010 | Lee et al. |
| 2010/0165255 A1 | 7/2010 | Ishitani et al. |
| 2011/0032435 A1 | 2/2011 | Kimura |
| 2011/0134345 A1 | 6/2011 | Yamazaki et al. |
| 2011/0299003 A1* | 12/2011 | Arasawa ........... G02F 1/136286 349/43 |
| 2013/0128174 A1 | 5/2013 | Kimura |

FOREIGN PATENT DOCUMENTS

| | | |
|---|---|---|
| EP | 1600936 A | 11/2005 |
| EP | 1737044 A | 12/2006 |
| EP | 2226847 A | 9/2010 |
| JP | 60-198861 A | 10/1985 |
| JP | 63-210022 A | 8/1988 |

(56) References Cited

FOREIGN PATENT DOCUMENTS

| | | |
|---|---|---|
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2009-237447 A | 10/2009 |
| JP | 2011-138118 A | 7/2011 |
| KR | 2011-0076725 A | 7/2011 |
| KR | 2012-0091425 A | 8/2012 |
| TW | 535294 | 6/2003 |
| TW | 200300546 | 6/2003 |
| TW | 200847086 | 12/2008 |
| TW | 200919049 | 5/2009 |
| TW | 201133100 | 10/2011 |
| WO | WO-2004/114391 | 12/2004 |
| WO | WO-2011/068021 | 6/2011 |

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by AR Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits, 2008, vol. 43, No. 1, pp. 292-299.

OHara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

(56) References Cited

OTHER PUBLICATIONS

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZNO TFTs) for AMLCDs", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo,H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
OHara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al, "Polymer-Stabilized Liquid Crystal Blue Phases", Nature Materials, Sep. 2, 2002, vol. 1, pp. 64-68.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at temperatures over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984. vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Taiwanese Office Action (Application No. 102124007) dated Sep. 26, 2016.
Taiwanese Office Action (Application No. 106109976) dated Nov. 30, 2017.

* cited by examiner

Image Signal with
Long Writing Time

Transmittance of
Liquid Crystal Element

Image Signal with
Short Writing Time

Transmittance of
Liquid Crystal Element

| | Si | Si+1 |
|---|---|---|
| First Frame Period | + | − |
| ↓ | ↓ | ↓ |
| Second Frame Period | − | + |
| ↓ | ↓ | ↓ |
| Third Frame Period | + | − |

FIG. 4A
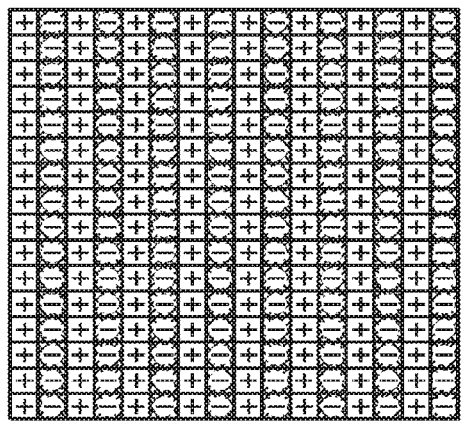 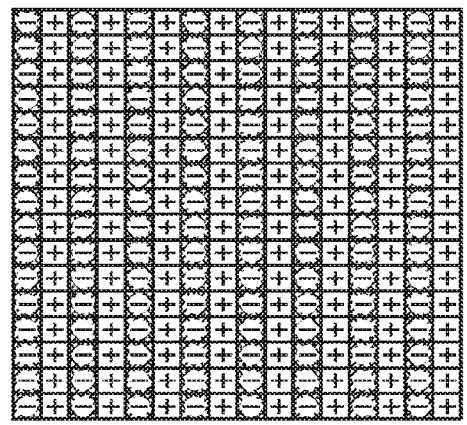
FIG. 4B
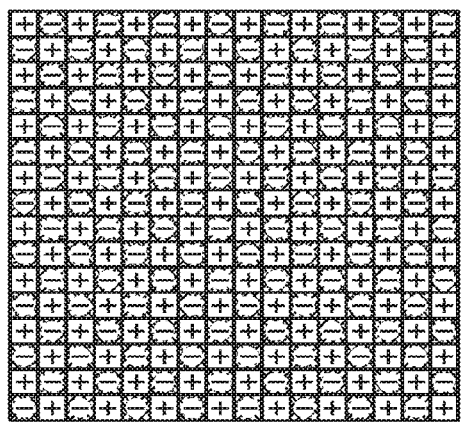 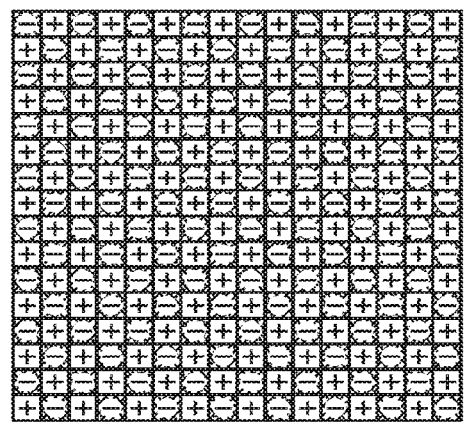

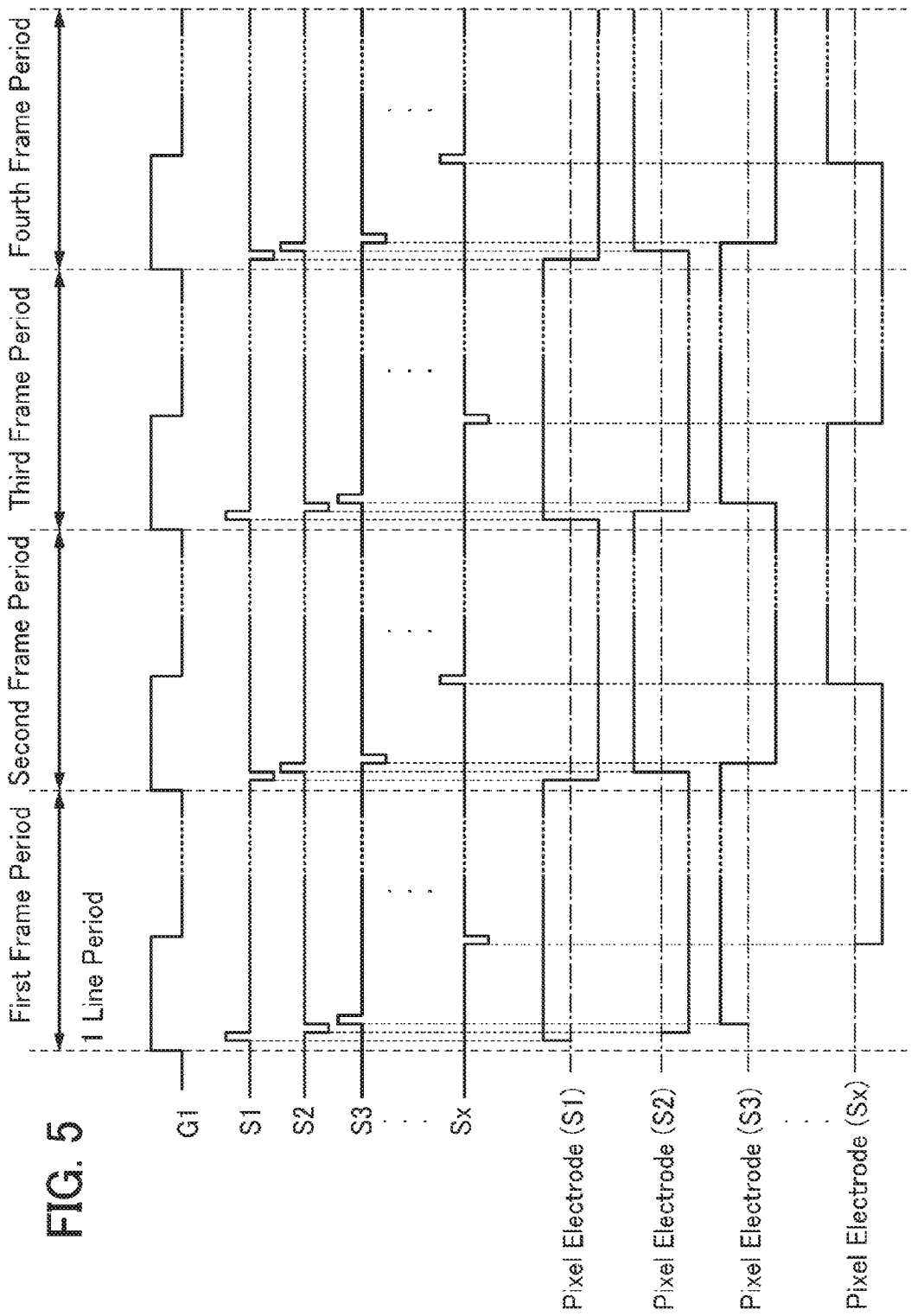

LIQUID CRYSTAL DISPLAY DEVICE AND METHOD FOR DRIVING THE SAME

BACKGROUND OF THE INVENTION

1. Field of the Invention

The present invention relates to an active-matrix liquid crystal display device including a transistor in a pixel and to a method for driving the liquid crystal display device.

2. Description of the Related Art

In recent years, a metal oxide having semiconductor characteristics, which is called an oxide semiconductor, has attracted attention as a novel semiconductor material having both high mobility provided by polysilicon or microcrystalline silicon and uniform element characteristics provided by amorphous silicon.

Examples of such a metal oxide having semiconductor characteristics include tungsten oxide, tin oxide, indium oxide, and zinc oxide. Transistors each including such a metal oxide having semiconductor characteristics in a channel formation region have been known (Patent Documents 1 and 2).

In addition, a liquid crystal display device in which a storage capacitor is omitted from a pixel and the aperture ratio of the pixel is increased owing to the use of a transistor with low leakage current in an off state, and a driving method thereof have been known (Non-Patent Document 1).

REFERENCE

Patent Document

[Patent Document 1] Japanese Published Patent Application No. 2007-123861
[Patent Document 2] Japanese Published Patent Application No. 2007-096055

Non-Patent Document

[Non-Patent Document 1] Hideaki Shishido et al., "76.1: High Aperture Ratio LCD Display using In—Ga—Zn-Oxide TFTs without Storage Capacitor", SID 10 DIGEST, pp. 1128-1131, 2010

SUMMARY OF THE INVENTION

In view of energy saving, electronic devices are required to operate with less power. Similarly, liquid crystal display devices used for electronic devices are required to consume less power. In particular, a reduction in power consumption of a portable electronic device allows a user to use the electronic device for a longer time.

In the case of a transmissive liquid crystal display device, if the percentage of a region transmitting light in a pixel (also referred to as aperture ratio) is increased, light emitted from a backlight can be efficiently utilized. As a result, power consumption can be reduced.

Meanwhile, a liquid crystal display device in a portable electronic device is viewed by a user at a short distance, thus being required to have a screen with high definition. An increase in the definition of a screen requires a reduction in the size of a pixel itself.

To increase the aperture ratio of a pixel while increasing the definition of a screen, a transistor, a capacitor, or the like included in the pixel needs to be reduced in size.

When the capacitance of a capacitor is reduced, the period for which the potential of an image signal can be held is shortened; accordingly, the quality of an image displayed on a liquid crystal display device is lowered. Moreover, it is difficult to reduce the capacitance of a capacitor in the case where a transistor with high leakage current in an off state is used.

One embodiment of the present invention is made in view of the foregoing technical background. Thus, an object of one embodiment of the present invention is to provide a liquid crystal display device whose power consumption is reduced while image quality is prevented from being degraded. Another object of one embodiment of the present invention is to provide a method for driving a liquid crystal display device whose power consumption is reduced while image quality is prevented from being degraded.

In order to achieve at least one of the above objects, one embodiment of the present invention is made with a focus on leakage current in an off state of a transistor which is used in a pixel, a capacitance component of a liquid crystal element, and the capacitance of a capacitor. This leads to a liquid crystal display device having a structure exemplified in this specification and to a driving method in which image signals having alternating opposite polarities are sequentially written into a plurality of pixels in the liquid crystal display device.

That is, one embodiment of the present invention is a liquid crystal display device which includes a transistor including a semiconductor material having a wider band gap and a lower intrinsic carrier density than silicon in a channel formation region and a liquid crystal element including a liquid crystal layer and a pixel electrode electrically connected to a source electrode or a drain electrode of the transistor. A minimum value of a capacitance ($C_X+C_{L1}$) of a pixel satisfies a formula (1) below and a maximum value of the capacitance ($C_X+C_{L2}$) of the pixel satisfies a formula (2) below.

$$170 \times 10^{-15} \ [F] > (C_X + C_{L1}) \quad (1)$$

$$(C_X + C_{L2}) > \frac{n}{m}(C_{L2} - C_{L1}) \quad (2)$$

Note that, in the formula (1) and the formula (2), $C_{L1}$ represents a minimum value of a capacitance component of the liquid crystal element in the pixel, $C_{L2}$ represents a maximum value of the capacitance component of the liquid crystal element in the pixel, ($C_{L2}-C_{L1}$) represents an amount of change in the capacitance component of the liquid crystal element, $C_X$ represents the capacitance of the pixel from which a capacitance due to the liquid crystal element is subtracted, n represents the number of gray levels included in an image signal, and m represents a difference between gray levels which is required to be able to be recognized. Note that [F] in the formula is a unit of capacitance.

The above liquid crystal display device of one embodiment of the present invention includes a transistor whose leakage current in an off state is reduced and a liquid crystal element. The capacitance of a pixel satisfies the formula (1) and the formula (2). Thus, the potential of an image signal written into the pixel can be held and the aperture ratio of the liquid crystal element can be increased. Consequently, a liquid crystal display device whose power consumption is reduced while image quality is prevented from being degraded can be provided.

An effect that is obtained when the minimum value of the capacitance ($C_X+C_{L1}$) of the pixel satisfies the formula (1) and the maximum value of the capacitance ($C_X+C_{L2}$) of the pixel satisfies the formula (2) is described below with reference to FIG. 2A.

FIG. 2A illustrates an equivalent circuit of a pixel 350G included in the liquid crystal display device of one embodiment of the present invention.

The pixel 350G includes a transistor 312 and a liquid crystal element 320G. A gate electrode of the transistor 312 is electrically connected to a scan line G. One of a source electrode and a drain electrode of the transistor 312 is electrically connected to a signal line S, and the other is connected to one electrode of the liquid crystal element 320G. The other electrode of the liquid crystal element 320G is supplied with a ground potential.

<<Relation Between Capacitance of Pixel and Leakage Current in Off State of Transistor>>

The relation between the capacitance of a pixel and current which leaks through a transistor in an off state is described. A voltage drop in a pixel attributed to current which leaks through a transistor in an off state can be estimated with a formula (3) below.

$$\left( \frac{i \times T}{C_X + C_{L1}} \right) \quad (3)$$

Note that, in the formula (3), ($C_X+C_{L1}$) represents the minimum value of a capacitance of the pixel, $C_{L1}$ represents the minimum value of a capacitance component of the liquid crystal element, i represents leakage current of the transistor in an off state, and T represents the length of time of one frame (the interval between writing image signals into the pixel).

The permittivity of a liquid crystal layer varies depending on the alignment state thereof. The capacitance component of the liquid crystal element varies accordingly. Here, the minimum value of the capacitance component of the liquid crystal element is $C_{L1}$. The capacitance of the pixel from which the capacitance component of the liquid crystal element is subtracted, $C_X$, includes parasitic capacitance and the like in addition to the capacitance of a capacitor provided in the pixel.

The maximum allowable amount of a voltage drop in a pixel can be represented by a formula (4).

$$\frac{V}{n} \times m \quad (4)$$

Note that, in the formula (4), V represents a driving voltage of a liquid crystal element, n represents the number of gray levels included in an image signal input, and m represents a difference between gray levels which is required to be recognizable (that is, two image signals which differ in gray level by m are required to be distinguishable). It is preferable that m be less than or equal to 1/50 times n, in which case rich gradation can be expressed.

Considered here is the case where the main cause of a voltage drop in a pixel is leakage current i in an off state of a transistor. When the minimum value of the capacitance ($C_X+C_{L1}$) of the pixel satisfies formulae (5), it is possible to distinguish image signals which differ in gray level by m.

$$\left( \frac{V}{n} \times m \right) > \left( \frac{i \times T}{C_X + C_{L1}} \right) \quad (5)$$

$$(C_X + C_{L1}) > i \times \left( \frac{T}{V} \times \frac{n}{m} \right)$$

The formulae (5) indicate that the minimum value of the capacitance ($C_X+C_{L1}$) of the pixel needs to be increased in proportion to leakage current i in an off state of a transistor used in the pixel. In other words, as the leakage current i is reduced, it becomes easier to increase the aperture ratio of a pixel while increasing the definition of a screen.

For example, when the length of time T of one frame (the interval between writing image signals into the pixel), the driving voltage of the liquid crystal element, the number of gray levels included in the image signal, and the difference between gray levels which is required to be able to be recognized are set to 1/60 sec, 5 V, 256, and 5, respectively, the minimum value of the capacitance ($C_X+C_{L1}$) of the pixel is estimated as follows.

Here, since a transistor including amorphous silicon in a channel formation region has low field-effect mobility, it would be difficult to reduce the size of the transistor. Therefore, it is impossible to increase the aperture ratio of a pixel while increasing the definition of a screen.

In the case of a conventional pixel in which a transistor including low-temperature polysilicon in a channel formation region (the ratio (W/L) of the channel width W to the channel length L is about 1, for example) is used, the current i which leaks through the transistor in an off state is about $1 \times 10^{-12}$ A. Accordingly, the minimum value of the capacitance ($C_X+C_{L1}$) of the pixel needs to be larger than 170 fF.

In a pixel included in the liquid crystal display device of one embodiment of the present invention, a transistor whose leakage current in an off state is reduced, specifically, a transistor including a semiconductor material having a wider band gap and a lower intrinsic carrier density than silicon in a channel formation region is used, which can make the minimum value of the capacitance ($C_X+C_{L1}$) of the pixel smaller than 170 fF.

Thus, the potential of an image signal can be held and the aperture ratio of a liquid crystal element can be increased. Consequently, a liquid crystal display device whose power consumption is reduced while image quality is prevented from being degraded can be provided.

Described next is the case where the current which leaks through the transistor in an off state is low enough to be excluded from consideration.

<<Relation Between Difference Between Gray Levels which is Required to be Able to be Recognized and Capacitance Component of Liquid Crystal Element which Changes in Accordance with Alignment of Liquid Crystal Layer>>

A liquid crystal element includes a liquid crystal layer, which is interposed between two substrates, in an electric field formed by a pair of electrodes. The pair of electrodes serves to apply an electric field to the liquid crystal layer. Examples of the arrangement of the pair of electrodes include the case where one electrode and the other electrode are provided on different substrates (e.g., the arrangement of electrodes in a vertical electric field mode) and the case where one electrode and the other electrode are provided on one substrate (e.g., the arrangement of electrodes in a horizontal electric field mode).

In this specification, a pixel electrode refers to one electrode of a liquid crystal element used in a liquid crystal display device, which is electrically connected to a source electrode or a drain electrode of a transistor provided in a pixel, and a common electrode refers to the other electrode. Note that a structure in which a common potential is supplied to the common electrode of a plurality of liquid crystal elements can simplify the liquid crystal display device.

Voltage applied to the pair of electrodes of the liquid crystal element changes the alignment state of liquid crystal included in the liquid crystal layer. Thus, the permittivity of the liquid crystal layer is changed and, accordingly, a capacitance component of the liquid crystal element is changed as well as the transmittance thereof.

The electrical characteristics of the liquid crystal element can be described with an equivalent circuit in which a capacitance component 320c and a resistance component 320r are connected to each other in parallel.

The capacitance component 320c of the liquid crystal element is described. The permittivity of liquid crystal has anisotropy. Since the liquid crystal layer includes liquid crystal, the permittivity of the liquid crystal layer changes in accordance with the alignment state of the liquid crystal. The capacitance component of the liquid crystal element also changes in accordance with the alignment state of the liquid crystal layer (which can also be referred to as the operation state of the liquid crystal element). For example, the capacitance component of the liquid crystal element in the liquid crystal display device varies between in black display and in white display.

The maximum value of the capacitance component of the liquid crystal element is about 1.5 times to 3.5 times (e.g., three times) the minimum value of the capacitance component of the liquid crystal element.

FIG. 2B shows the case where the time for writing an image signal into a pixel is substantially equal to the time that is required for changing the alignment state of liquid crystal (e.g., where the time for writing an image signal into a pixel is about several milliseconds).

FIG. 2C shows the case where the time for writing an image signal into a pixel is shorter than the time that is required for changing the alignment state of liquid crystal (e.g., where the time for writing an image signal into a pixel is about several microseconds).

Here, if input of an image signal is stopped before the transmittance of the liquid crystal element changes to a desired degree, the voltage applied to the liquid crystal element drops owing to a decrease in permittivity which accompanies a change in the alignment state of the liquid crystal layer. Thus, the transmittance of the liquid crystal element sometimes cannot reach the desired transmittance.

The amount of a drop in voltage of a liquid crystal element attributed to a change in alignment state is represented by the right side of a formula (6) below. The allowable amount of the voltage drop is smaller than the left side of the formula (6).

$$\left(\frac{V}{n} \times m\right) > \left(\frac{C_{L2} - C_{L1} - \frac{T}{2R}}{C_X + C_{L2} + \frac{T}{2R}}\right) \times V \quad (6)$$

Note that, in the formula (6), V represents a driving voltage of the liquid crystal element, n represents the number of gray levels included in an image signal input, m represents the difference between gray levels which is required to be able to be recognized, T represents the length of time of one frame (the interval between writing image signals into a pixel), and $C_X$ represents a capacitance of the pixel from which a capacitance component of the liquid crystal element is subtracted. Further, $C_{L1}$ represents the minimum value of the capacitance component of the liquid crystal element, $C_{L2}$ represents the maximum value of the capacitance component of the liquid crystal element, and R represents a resistance component of the liquid crystal element.

Here, when the length of time T of one frame (the interval between writing image signals into the pixel) is a time such that a flicker is not recognized (specifically, 1/60 sec) or shorter and the resistance component of the liquid crystal element is sufficiently large, the term (T/2R) is small enough to be ignorable. Thus, the formula (6) can be approximated by a formula (7).

$$\left(\frac{V}{n} \times m\right) > \left(\frac{C_{L2} - C_{L1}}{C_X + C_{L2}}\right) \times V \quad (7)$$

By transformation of the formula (7), the maximum value of the capacitance ($C_X+C_{L2}$) of the pixel can be represented by the formula (2).

That is, in the liquid crystal display device of one embodiment of the present invention, the maximum value of the capacitance ($C_X+C_{L2}$) of the pixel is larger than the product of the amount of change ($C_{L2}-C_{L1}$) in the capacitance component of the liquid crystal element and (n/m).

Thus, the potential of an image signal can be held and the aperture ratio of the liquid crystal element can be increased. Consequently, a liquid crystal display device whose power consumption is reduced while image quality is prevented from being degraded can be provided.

<<Capacitance of Pixel (from which Capacitance Component of Liquid Crystal Element is Subtracted)>>

Described below is an example of calculation of the capacitance of a pixel in the liquid crystal display device of one embodiment of the present invention.

Here, the number n of displayed gray levels is 256, the difference m between gray levels which is required to be able to be recognized is 5, and the driving voltage V of the liquid crystal element is 5 V. The density at which pixels are arranged is 300 per inch.

The minimum value of the capacitance component $C_{L1}$ of the liquid crystal element is 1 fF, and the maximum value of the capacitance component $C_{L2}$ of the liquid crystal element is 3 fF.

The capacitance of the pixel from which the capacitance component of the liquid crystal element is subtracted, $C_X$, is made larger than 100 fF, which enables the pixel to be applied to a liquid crystal display device.

For adjustment of the capacitance of a pixel, a capacitor may be provided in the pixel, for example. The capacitor may be formed with, for example, a layer forming a gate electrode of a transistor provided in the pixel, a layer forming a source electrode or a drain electrode of the transistor, and an insulating film such as a gate insulating film provided therebetween.

Another embodiment of the present invention is the above liquid crystal display device having a structure in which the liquid crystal element includes an insulating layer, a pixel electrode in contact with one surface of the insulating layer, and a common electrode which is in contact with the other surface of the insulating layer and has an opening overlapping with the pixel electrode.

The above liquid crystal display device of one embodiment of the present invention includes the pixel electrode on one surface of the insulating layer and the common electrode on the other surface thereof. The common electrode has an opening overlapping with the pixel electrode. This structure can prevent or reduce a short circuit between the pixel electrode and the common electrode, which is caused when, in a step of overlapping a sealing substrate with a substrate provided with the pixel electrode in manufacture of the liquid crystal element, a foreign substance between the substrates is unintentionally embedded in the substrate provided with the pixel electrode. Consequently, a liquid crystal display device whose power consumption is reduced while image quality is prevented from being degraded can be provided with high yield.

Another embodiment of the present invention is a liquid crystal display device including a plurality of scan lines extending in a row direction, a plurality of signal lines intersecting with the scan lines and extending in a column direction, and a pixel in a region surrounded by adjacent scan lines and adjacent signal lines. Both the scan lines and the signal lines are arranged at a density of 300 or more per inch. The pixel includes a transistor including a semiconductor material having a wider band gap and a lower intrinsic carrier density than silicon in a channel formation region, a gate electrode electrically connected to one scan line, and a source electrode and a drain electrode one of which is electrically connected to one signal line and a liquid crystal element including a pixel electrode electrically connected to the other of the source electrode and the drain electrode of the transistor, a liquid crystal layer, and a common electrode. A minimum value of a capacitance $(C_X+C_{L1})$ of the pixel satisfies the formula (1) and a maximum value of the capacitance $(C_X+C_{L2})$ of the pixel satisfies the formula (2).

Note that, in the formula (1) and the formula (2), $C_{L1}$ represents a minimum value of a capacitance component of the liquid crystal element, $C_{L2}$ represents a maximum value of the capacitance component of the liquid crystal element, $(C_{L2}-C_{L1})$ represents an amount of change in the capacitance component of the liquid crystal element, $C_X$ represents the capacitance of the pixel from which a capacitance due to the liquid crystal element is subtracted, n represents the number of gray levels included in an image signal, and m represents a difference between gray levels which is required to be able to be recognized. Note that [F] in the formula is a unit of capacitance.

The above liquid crystal display device of one embodiment of the present invention includes the transistor whose leakage current in an off state is reduced and the liquid crystal element. The capacitance of the pixel satisfies the formula (1) and the formula (2). Such pixels are included in a matrix at a density of 300 or more per inch. In this structure, the potential of an image signal that is written into each of the pixels arranged at a high density can be held and the aperture ratio of the liquid crystal element can be increased. Consequently, a liquid crystal display device whose power consumption is reduced while image quality is prevented from being degraded can be provided.

Another embodiment of the present invention is a method for driving the above liquid crystal display device, including a first step of inputting a selection signal to one scan line to select a plurality of pixels electrically connected to the scan line and a second step of inputting image signals having alternating opposite polarities to a first signal line and a second signal line arranged with a pixel provided therebetween to sequentially write the image signals into the selected plurality of pixels.

The above method for driving the liquid crystal display device of one embodiment of the present invention includes the first step of selecting a plurality of pixels electrically connected to one scan line and the second step of sequentially writing image signals having alternating opposite polarities into the selected plurality of pixels. In this method, the potentials of a pair of signal lines change in opposite polarity directions, whereby the fluctuation of the potential of a pixel electrode can be cancelled out; thus, crosstalk can be reduced. Consequently, a method for driving a liquid crystal display device whose power consumption is reduced while image quality is prevented from being degraded can be provided.

Note that in this specification, a display device refers to a device which displays an image based on image data. In addition, the display device includes any of the following modules in its category: a module in which a connector such as a flexible printed circuit (FPC) or a tape carrier package (TCP) is attached to a display device; a module having a TCP provided with a printed wiring board at the end thereof; and a module having an integrated circuit (IC) directly mounted over a substrate over which a display element is formed by a chip on glass (COG) method.

Note that in this specification, a capacitor is distinguished from a capacitance component of the liquid crystal element itself.

Unless otherwise specified, in the case of an n-channel transistor, an off-state current in this specification is a current that flows between a source electrode and a drain electrode when the voltage between the gate electrode and the source electrode is less than or equal to zero while the potential of the drain electrode is higher than that of the source electrode and that of a gate electrode. Further, in the case of a p-channel transistor, an off-state current in this specification is a current that flows between a source electrode and a drain electrode when the voltage between the gate electrode and the source electrode is greater than or equal to zero while the potential of the drain electrode is lower than that of the source electrode and that of a gate electrode.

The names of the "source electrode" and the "drain electrode" included in the transistor interchange with each other depending on the polarity of the transistor or the levels of potentials supplied to the respective electrodes. In general, in an n-channel transistor, an electrode to which a lower potential is supplied is called a source electrode, and an electrode to which a higher potential is supplied is called a drain electrode. Further, in a p-channel transistor, an electrode to which a lower potential is supplied is called a drain electrode, and an electrode to which a higher potential is supplied is called a source electrode.

Further, in this specification, the state in which the transistors are connected to each other in series means, for example, a state in which only one of a first terminal and a second terminal of a first transistor is connected to only one of a first terminal and a second terminal of a second transistor. The state in which the transistors are connected to each other in parallel means a state in which the first terminal of the first transistor is connected to the first terminal of the second transistor and the second terminal of the first transistor is connected to the second terminal of the second transistor.

Note that in this specification, the term "connection" means electrical connection and corresponds to a state in which current, voltage, or a potential can be supplied or transmitted. Accordingly, a connection state means not only a state of direct connection but also a state of indirect connection through a circuit element such as a wiring, a resistor, a diode, or a transistor so that current, voltage, or a potential can be supplied or transmitted.

In addition, even when different components are connected to each other in a circuit diagram, there is actually a case where one conductive film has functions of a plurality of components, such as a case where part of a wiring serves as an electrode. The term "connection" also means such a case where one conductive film has functions of a plurality of components.

According to one embodiment of the present invention, a liquid crystal display device whose power consumption is reduced while image quality is prevented from being degraded can be provided. Further, a method for driving a liquid crystal display device whose power consumption is reduced while image quality is prevented from being degraded can be provided.

BRIEF DESCRIPTION OF THE DRAWINGS

FIGS. 4A and 4B each show a method for driving a liquid crystal display device according to one embodiment.

FIG. 5 is a timing chart showing a method for driving a liquid crystal display device according to one embodiment.

DETAILED DESCRIPTION OF THE INVENTION

Figure 1A:
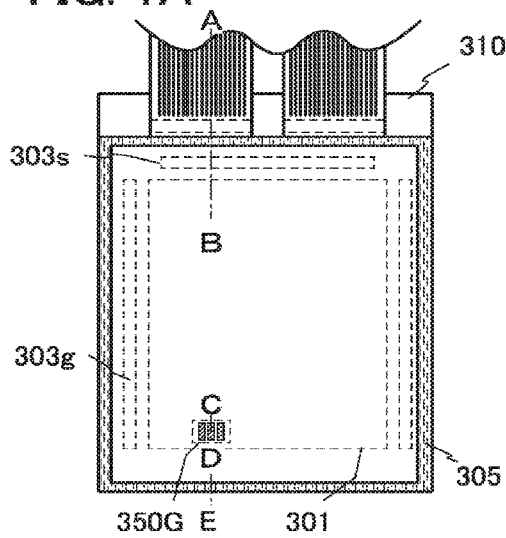
FIGS. 1A to 1D illustrate a liquid crystal display device according to one embodiment.

Embodiment will be described in detail with reference to the accompanying drawings. Note that the invention is not limited to the following description, and it is easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

Embodiment 1

Figure 1B:
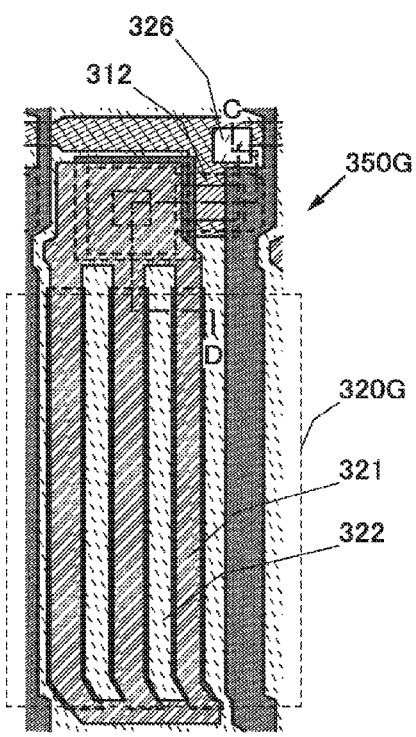
Figure 1C:
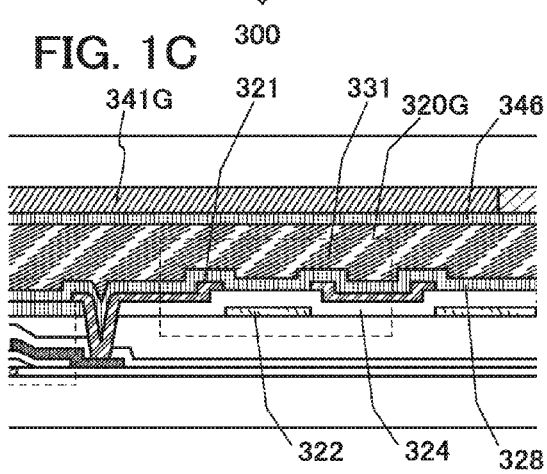
Figure 1D:
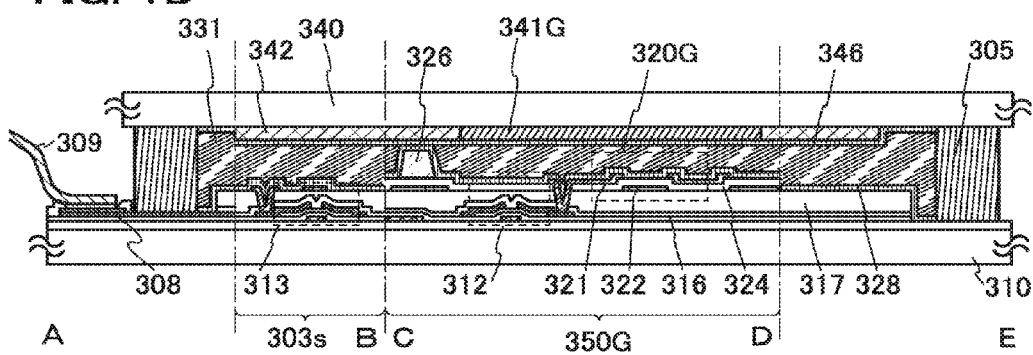
Figure 2A:
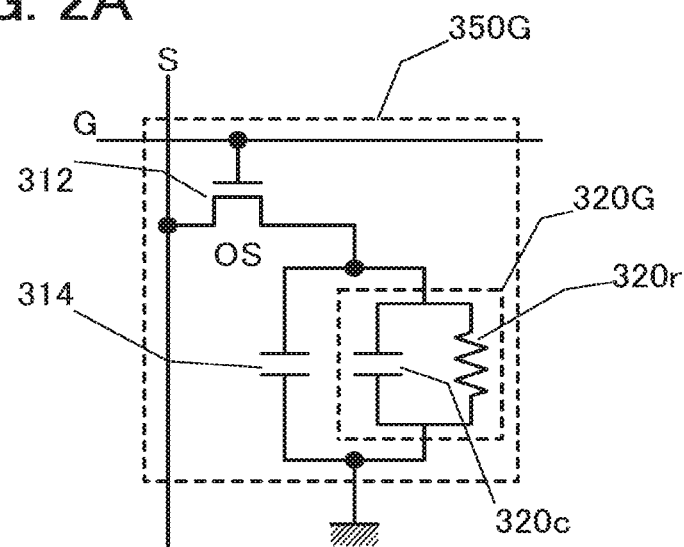
FIGS. 2A to 2C illustrate a liquid crystal display device according to one embodiment.
Figure 2B:
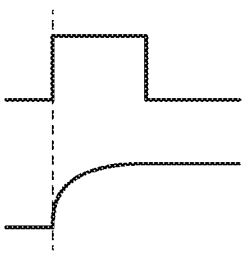
Figure 2C:
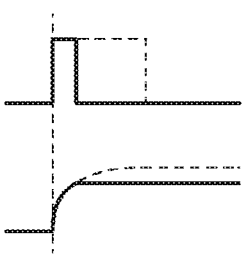

In this embodiment, a structure of a liquid crystal display device of one embodiment of the present invention will be described with reference to FIGS. 1A to 1D and FIGS. 2A to 2C. FIG. 1A is a top view of a liquid crystal display device of one embodiment of the present invention. FIG. 1B is a top view of a pixel included in the liquid crystal display device. FIG. 1C is a side view including part of a cross section taken along line C-D in FIGS. 1A and 1B. FIG. 1D is a side view including a cross section taken along line A-B and line C-D-E in FIG. 1A. FIG. 2A is an equivalent circuit diagram of the pixel 350G included in the liquid crystal display device. FIGS. 2B and 2C each illustrate a signal written into a pixel and the transmittance of a liquid crystal element.

A liquid crystal display device 300 described as an example in this embodiment includes the transistor 312 including a semiconductor material having a wider band gap and a lower intrinsic carrier density than silicon in a channel formation region and the liquid crystal element 320G including a liquid crystal layer 331 and a pixel electrode 321 electrically connected to a source electrode or a drain electrode of the transistor 312. The minimum value of a capacitance ($C_X + C_{L1}$) of the pixel 3500 satisfies the formula (1) and the maximum value of the capacitance ($C_X + C_{L2}$) of the pixel 350G satisfies the formula (2) (see FIGS. 1A and 1D).

Note that, in the formula (1) and the formula (2), $C_X$ represents the capacitance of the pixel 350G from which a capacitance due to the liquid crystal element 3200 is subtracted, $C_{L1}$ represents the minimum value of a capacitance component of the liquid crystal element 320G, $C_{L2}$ represents the maximum value of the capacitance component of the liquid crystal element 320, ($C_{L2} - C_{L1}$) represents an amount of change in the capacitance component of the liquid crystal element 320G, n represents the number of gray levels, and m represents a difference between gray levels which is required to be recognizable (that is, two image signals which differ in gray level by m are required to be distinguishable).

The liquid crystal display device 300 includes a plurality of pixels including the pixel 350G in a display region 301. The liquid crystal display device 300 also includes driver circuits (a gate side driver circuit 303g and a source side driver circuit 303s) which drive the pixels (see FIG. 1A).

The pixel 350G includes the transistor 312, the pixel electrode 321, and a common electrode 322 (see FIG. 1B).

The transistor 312 in the pixel 350G is provided over a first substrate 310. Note that a transistor 313 in the source side driver circuit 303s can be formed through the same process as the transistor 312.

An insulating layer 316 covers semiconductor layers of the transistors 312 and 313 to prevent diffusion of impurities into the semiconductor layers. An insulating layer 317 serves to planarize unevenness which is caused by a structure (e.g., the transistor 312 or a signal line) formed over the first substrate 310.

An external input terminal is provided at the tip of a lead wiring 308. Further, a flexible printed circuit (FPC) 309 is connected to the external input terminal. A video signal, a clock signal, a start signal, a reset signal, and the like are input to the liquid crystal display device 300 through the FPC 309. A printed wiring board (PWB) may be attached to the FPC 309. The display panel in this specification includes not only a main body of the display panel but one with an FPC or a PWB attached thereto.

A sealant 305 surrounds the display region 301, the gate side driver circuit 303g8, and the source side driver circuit 303s and attaches the first substrate 310 to a second substrate 340. A spacer 326 adjusts the height of a space between the first substrate 310 and the second substrate 340. The space whose height is adjusted is filled with the liquid crystal layer 331.

<Liquid Crystal Element>

In the liquid crystal element 320G, the liquid crystal layer 331 is provided in an electric field between the pixel electrode 321 and the common electrode 322. An alignment film 328 is formed over the first substrate 310 to be in contact with the liquid crystal layer 331, and an alignment film 346 is formed below the second substrate 340 to be in contact with the liquid crystal layer 331.

The pixel electrode 321 has a comb-like shape or an island shape and overlaps with a color filter 341G.

The common electrode 322 in the pixel of the liquid crystal display device exemplified in this embodiment is in contact with one surface of an insulating layer 324 and overlaps with the color filter 341G. The common electrode 322 has an opening which overlaps with the pixel electrode 321. The pixel electrode 321 is in contact with the other surface of the insulating layer 324 (see FIGS. 1B and 1C).

The opening in the common electrode 322 has an effect of reducing unnecessary capacitance by reducing an overlap with the pixel electrode 321. The opening also can prevent or reduce a short circuit between the pixel electrode 321 and the common electrode 322, which is caused when a foreign substance between the substrates is unintentionally embedded in the first substrate in a step of overlapping the second substrate with the first substrate. Consequently, the liquid crystal display device 300 whose power consumption is reduced while image quality is prevented from being degraded can be provided with high yield.

Note that the common electrode 322 intersects with the pixel electrode 321 in a region overlapping with a light-blocking layer 342. A modification example of this embodiment is as follows: the common electrode 322 is not provided with an opening and the pixel electrode 321 is overlapped with the common electrode 322, and the liquid crystal display device is driven in a fringe field switching (FFS) mode.

The insulating layer 324 covers the common electrode 322. The pixel electrode 321 is formed over the insulating layer 324.

The second substrate 340 is provided with the color filter 341G and the light-blocking layer 342.

The pixel 350G includes the liquid crystal element 320G and the color filter 341G overlapping with the liquid crystal element 320G. The light-blocking layer 342 is provided to overlap with a region between the pixel 350G and an adjacent pixel (see FIG. 1D).

Note that any of a variety of liquid crystal elements can be used in the liquid crystal display device of one embodiment of the present invention. For example, a twisted nematic (TN) mode, an in-plane-switching (IPS) mode, an FFS mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like can be used. Alternatively, a vertical alignment (VA) mode may be used. As the vertical alignment mode, a multi-domain vertical alignment (MVA) mode, a patterned vertical alignment (PVA) mode, or an advanced super view (ASV) mode can be used, for example.

<Electrical Characteristics of Pixel>

The electrical characteristics of the pixel 350G can be described with reference to the equivalent circuit in FIG. 2A. The pixel 350G includes the transistor 312 and the liquid crystal element 320G. The gate electrode of the transistor 312 is electrically connected to the scan line G. One of the source electrode and the drain electrode of the transistor 312 is electrically connected to the signal line S, and the other is connected to one electrode of the liquid crystal element 320G. The other electrode of the liquid crystal element 320G is supplied with a ground potential.

The liquid crystal element 320G has the resistance component 320r and the capacitance component 320c, which are connected in parallel to the electrodes of the liquid crystal element 320G.

The pixel 350G has capacitance. The capacitance of the pixel 350G includes, in addition to the capacitance component 320c of the liquid crystal element 320G parasitic capacitance between the gate electrode and the drain electrode of the transistor 312 and parasitic capacitance between wirings. The capacitance of the pixel 35G from which the capacitance component of the liquid crystal element 320G is subtracted is referred to as capacitance 314.

In the equivalent circuit, the capacitance 314 and the liquid crystal element 320G can be regarded as being connected in parallel to the other of the source electrode and the drain electrode of the transistor 312.

Note that the pixel 350G may be provided with a capacitor for adjusting the capacitance of the pixel 350G. The capacitor may be formed by overlapping the pixel electrode 321 with the common electrode 322, or by providing a conductive film in the same layer as the gate electrode and a conductive film in the same layer as the source electrode or the drain electrode such that the conductive films overlap with each other.

<<Voltage Drop Due to Leakage Current>>

In the liquid crystal display device of one embodiment of the present invention, there are three typical paths through which current leaks from a pixel into which an image signal is written. Current which leaks through these three paths causes a drop in the voltage of the liquid crystal element. The estimated amount of the voltage drop is mentioned below. Note that the density at which pixels are arranged is 300 per inch.

As the first path, current leaks through the transistor in an off state. The current which leaks through the transistor can be about $10^{-18}$ A. Further, current which leaks through a gate insulating film of the transistor is estimated to be about $10^{-18}$ A.

As the second and third paths, current leaks through the liquid crystal element and through the capacitor. The leakage current is estimated to be about $10^{-18}$ A as for both the second and third paths. According to the above, the total leakage current is about $10^{-17}$ A. Note that the resistance component of the liquid crystal element is about $10^{13}$ Ω·cm to $10^{14}$ Ω·cm.

In the case where the capacitance of the pixel is 1 fF, the amount of a voltage drop due to leakage current within 1/60 sec (when a pixel circuit is driven at a frequency of 60 Hz) is estimated to be about $10^{-6}$ V. A voltage drop of such a degree does not cause a problem in the case of a liquid crystal element that is driven by several volts.

In the case where the pixel is not provided with capacitance, the amount of the voltage drop due to leakage current within 1/60 sec is estimated to be about $10^{-4}$ V.

The above liquid crystal display device 300 exemplified in this embodiment includes the transistor 312 whose leakage current in an off state is reduced and the liquid crystal element 320G. The capacitance of the pixel 350G satisfies the formula (1) and the formula (2). Thus, the potential of an image signal written into the pixel 350G can be held and the aperture ratio of the liquid crystal element 320G can be increased. Consequently, the liquid crystal display device 300 whose power consumption is reduced while image quality is prevented from being degraded can be provided.

Elements included in the liquid crystal display device 300 of one embodiment of the present invention are described below.

<Transistor>

An insulated-gate field effect transistor (hereinafter simply referred to as a transistor) having an extremely low off-state current can be used in the liquid crystal display device of one embodiment of the present invention.

For example, it is possible to use a transistor that includes a semiconductor material having a wider band gap and a lower intrinsic carrier density than silicon in a channel formation region. Specifically, a compound semiconductor such as silicon carbide (SiC) or gallium nitride (GaN), an oxide semiconductor including a metal oxide such as zinc oxide (ZnO), and the like can be used as the semiconductor material. Some oxide semiconductors have a band gap about three times as wide as that of silicon.

With a channel formation region including a semiconductor material having such characteristics, a transistor with an extremely low off-state current and a high withstand voltage can be obtained. By using a transistor having an extremely low off-state current in a pixel, the potential of an image signal can be held for a longer period as compared to the case of using a transistor formed using a normal semiconductor material such as silicon or germanium.

Among the above, an oxide semiconductor has an advantage of high mass productivity because an oxide semiconductor can be formed by sputtering, a wet process (e.g., a printing method), or the like. In addition, the process temperature of the oxide semiconductor is as low as 300° C. to 500° C. (the glass transition temperature or lower, about 700° C. at the maximum), whereas the process temperature of silicon carbide and that of gallium nitride are about 1500° C. and about 1100° C., respectively; therefore, the oxide semiconductor can be formed over a glass substrate which is inexpensively available. Further, a larger substrate can be used. Accordingly, among the semiconductors, the oxide semiconductor particularly has an advantage of high mass productivity. Further, in the case where an oxide semiconductor with high crystallinity is to be obtained in order to improve the performance of a transistor (e.g., field-effect mobility), the oxide semiconductor with crystallinity can be easily obtained by heat treatment at 450° C. to 800° C.

Note that a purified oxide semiconductor (purified OS) obtained by reduction of impurities such as moisture or hydrogen which serves as an electron donor (donor) is an intrinsic (i-type) semiconductor or a substantially i-type semiconductor. Therefore, a transistor including the oxide semiconductor has a characteristic of extremely low off-state current.

Specifically, the hydrogen concentration in a purified oxide semiconductor film which is measured by secondary ion mass spectrometry (SIMS) is less than or equal to $5 \times 10^{19}/cm^3$, preferably less than or equal to $5 \times 10^{18}/cm^3$, more preferably less than or equal to $5 \times 10^{17}/cm^3$, still more preferably less than or equal to $1 \times 10^{16}/cm^3$. In addition, the carrier density of the oxide semiconductor film, which can be measured by Hall effect measurement, is less than $1 \times 10^{14}/cm^3$, preferably less than $1 \times 10^{12}/cm^3$, more preferably less than $1 \times 10^{11}/cm^3$. Furthermore, the band gap of the oxide semiconductor is 2 eV or more, preferably 2.5 eV or more, more preferably 3 eV or more. By using the oxide semiconductor film which is purified by sufficiently reducing the concentration of impurities such as moisture or hydrogen, off-state current of the transistor can be reduced.

The analysis of the hydrogen concentration in the oxide semiconductor film is described here. The hydrogen concentration in the oxide semiconductor film and a conductive film is measured by SIMS. It is known to be difficult to obtain accurate data in the proximity of a surface of a sample or in the proximity of an interface between stacked films formed of different materials by the SIMS analysis in principle. Thus, in the case where the distribution of the hydrogen concentration in the thickness direction of a film is analyzed by SIMS, the average value of the hydrogen concentration in a region of the film where almost the same value can be obtained without significant variation is employed as the hydrogen concentration. Further, in the case where the thickness of the film is small, a region where almost the same value can be obtained cannot be found in some cases due to the influence of the hydrogen concentration of an adjacent film. In this case, the maximum value or the minimum value of the hydrogen concentration in a region where the film is provided is employed as the hydrogen concentration of the film. Furthermore, in the case where a maximum value peak and a minimum value valley do not exist in the region where the film is provided, the value of the inflection point is employed as the hydrogen concentration.

Various experiments can actually prove a small amount of off-state current of the transistor including the purified oxide semiconductor film as an active layer. For example, even with an element with a channel width of $1 \times 10^6$ μm and a channel length of 10 μm, in a range of from 1 V to 10 V of voltage (drain voltage) between a source electrode and a drain electrode, it is possible that off-state current (which is drain current in the case where voltage between a gate electrode and the source electrode is 0 V or less) is less than or equal to the measurement limit of a semiconductor parameter analyzer, that is, less than or equal to $1 \times 10^{-13}$ A. In this case, it can be found that an off-state current density corresponding to a value obtained by dividing the off-state current by the channel width of the transistor is less than or equal to 100 zA/μm. In addition, a capacitor and a transistor were connected to each other and the off-state current density was measured by using a circuit in which electric charge flowing into or from the capacitor was controlled by the transistor. In the measurement, the purified oxide semiconductor film was used as a channel formation region in the transistor, and the off-state current density of the transistor was measured from change in the amount of electric charge of the capacitor per unit time. As a result, it was found that in the case where the voltage between the source electrode and the drain electrode of the transistor was 3V, a lower off-state current density of several tens of yoctoamperes per micrometer (yA/μm) was able to be obtained. Thus, in a semiconductor device according to one embodiment of the present invention, the off-state current density of a transistor in which a purified oxide semiconductor film is used as an active layer can be less than or equal to 100 yA/pun, preferably less than or equal to 10 yA/μm, further preferably less than or equal to 1 yA/μm depending on the voltage between a source electrode and a drain electrode. Accordingly, the transistor including the purified oxide semiconductor film as an active layer has much lower off-state current than a transistor including crystalline silicon.

In addition, a transistor including a purified oxide semiconductor shows almost no temperature dependence of off-state current. This is because an impurity serving as an electron donor (donor) in the oxide semiconductor is removed and the oxide semiconductor is purified, so that a conductivity type is close to a substantially intrinsic type and the Fermi level is located in the center of the forbidden band. This also results from the fact that the oxide semiconductor has an energy gap of 3 eV or more and includes very few thermally excited carriers. In addition, the source electrode and the drain electrode are in a degenerated state, which is also a factor for showing no temperature dependence. The transistor is mostly operated with carriers injected into the oxide semiconductor from the degenerated source electrode and the carrier density has no dependence on temperature; therefore, the off-state current has no dependence on temperature.

As the oxide semiconductor, a four-component metal oxide such as an In—Sn—Ga—Zn-based oxide; a three-component metal oxide such as an In—Ga—Zn-based oxide, an In—Sn—Zn-based oxide, an In—Al—Zn-based oxide, a Sn—Ga—Zn-based oxide, an Al—Ga—Zn-based oxide, or a Sn—Al—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; indium oxide; tin oxide; zinc oxide; or the like can be used. Note that in this specification, for example, an In—Sn—Ga—Zn-based oxide means a metal oxide containing indium (In), tin (Sn), gallium (Ga), and zinc (Zn), and there is no particular limitation on the composition thereof. The above oxide semiconductor may contain silicon.

A material represented by $InMO_3(ZnO)_m$ (m>0, m is not an integer) may be used as the oxide semiconductor. Note that M represents one or more metal elements selected from Ga, Fe, Mn, and Co. Alternatively, a material represented by $In_2SnO_5(ZnO)_n$ (n>0, n is an integer) may be used as the oxide semiconductor.

With a channel formation region including a semiconductor material having the above characteristics, a transistor with an extremely low off-state current and a high withstand voltage can be obtained. Further, when the transistor having the above-described structure is used as a switching element, leakage of charge accumulated in a liquid crystal element can be prevented effectively as compared to the case of using a transistor including a normal semiconductor material such as silicon or germanium. Accordingly, the potential of an image signal can be held for a longer period, so that without a capacitor for holding a potential of an image signal connected to the liquid crystal element, the quality of the displayed image can be prevented from being lowered. Thus, it is possible to increase the aperture ratio by reducing the size of a capacitor or by not providing a capacitor, which leads to a reduction in power consumption of the liquid crystal display device.

Note that this embodiment can be combined with any of the other embodiments in this specification as appropriate.

Embodiment 2

Figure 3A:
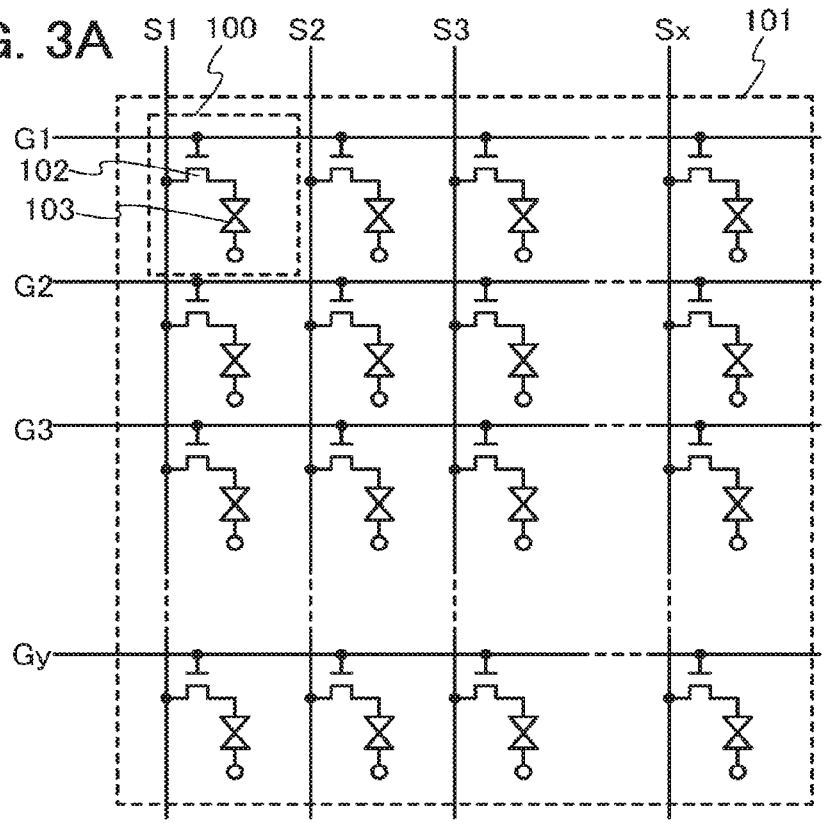
FIGS. 3A and 3B are circuit diagrams illustrating a liquid crystal display device according to one embodiment.

In this embodiment, a structure of a liquid crystal display device of one embodiment of the present invention is described with reference to FIG. 3A. FIG. 3A is a circuit diagram illustrating a structure of a display portion of a liquid crystal display device of one embodiment of the present invention.

The liquid crystal display device exemplified in this embodiment includes a plurality of scan lines (scan lines G1 to Gy) extending in a row direction, a plurality of signal lines (signal lines S1 to Sx) intersecting with the scan lines and extending in a column direction, and a pixel 100 provided in a region surrounded by adjacent scan lines (e.g., the scan lines G1 and G2) and adjacent signal lines (e.g., the signals lines S1 and S2). Both the scan lines and the signal lines are arranged at a density of 300 or more per inch (see FIG. 3A).

The pixel 100 includes a transistor 102 including a semiconductor material having a wider band gap and a lower intrinsic carrier density than silicon in a channel formation region, a gate electrode electrically connected to one scan line, and a source electrode and a drain electrode one of which is electrically connected to one signal line and a liquid crystal element 103 including a pixel electrode electrically connected to the other of the source electrode and the drain electrode of the transistor 102, a liquid crystal layer, and a common electrode. The minimum value of a capacitance $(C_X+C_{L1})$ of the pixel 100 satisfies the formula (1) and the maximum value of the capacitance $(C_X+C_{L2})$ of the pixel 100 satisfies the formula (2).

Note that, in the formula (1) and the formula (2), $C_X$ represents the capacitance of the pixel 100 from which a capacitance due to the liquid crystal element 103 is subtracted, $C_{L1}$ represents the minimum value of a capacitance component of the liquid crystal element 103, $C_{L2}$ represents the maximum value of the capacitance component of the liquid crystal element 103, $(C_{L2}-C_{L1})$ represents an amount of change in the capacitance component of the liquid crystal element 103, n represents the number of gray levels, and m represents a difference between gray levels which is required to be recognizable (that is, two image signals which differ in gray level by m are required to be distinguishable).

The above liquid crystal display device exemplified this embodiment includes the transistor 102 whose leakage current in an off state is reduced and the liquid crystal element 103. The capacitance of the pixel 100 satisfies the formula (1) and the formula (2). The pixels 100 are included in a matrix at a density of 300 or more per inch. Thus, the potential of an image signal written into the pixel can be held and the aperture ratio of the liquid crystal element can be increased. Consequently, a liquid crystal display device whose power consumption is reduced while image quality is prevented from being degraded can be provided.

Each of the pixels 100 includes at least one of the signal lines S to Sx and at least one of the scan lines G1 to Gy. In addition, the pixel 100 includes the transistor 102 which functions as a switching element and the liquid crystal element 103. The liquid crystal element 103 includes a pixel electrode, a common electrode, and liquid crystal to which voltage between the pixel electrode and the common electrode is applied.

The transistor 102 controls whether a potential of the signal line, that is, a potential of an image signal is supplied to the pixel electrode of the liquid crystal element 103. A predetermined reference potential is supplied to the common electrode of the liquid crystal element 103.

Next, a specific connection relation of the transistor 102 and the liquid crystal element 103 is described. Note that one of a source electrode and a drain electrode is referred to as a first terminal, and the other, a second terminal.

A gate electrode of the transistor 102 is connected to any one of the scan lines G1 to Gy. A first terminal of the transistor 102 is connected to any one of the signal lines S1 to Sx, and a second terminal of the transistor 102 is connected to the pixel electrode of the liquid crystal element 103.

Note that the pixel 100 may further include another circuit element such as a transistor, a diode, a resistor, a capacitor, or an inductor as needed.

Note that FIG. 3A illustrates a case where one transistor 102 is used as a switching element in the pixel 100; however, one embodiment of the present invention is not limited to this structure. A plurality of transistors may be used as one switching element. In the case where a plurality of transistors function as one switching element, the plurality of transistors may be connected to each other in parallel, in series, or in combination of parallel connection and series connection.

Note that this embodiment can be combined with any of the other embodiments in this specification as appropriate.

Embodiment 3

Figure 3B:
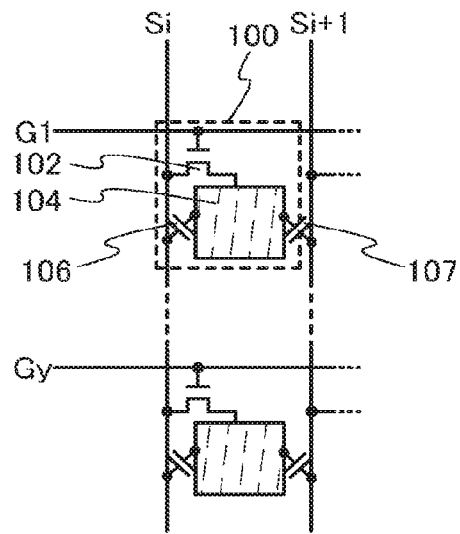

In this embodiment, a method for driving the liquid crystal display device of one embodiment of the present invention exemplified in Embodiment 2 is described with reference to FIGS. 3A and 3B and FIGS. 4A and 4B. FIG. 3A is a circuit diagram illustrating the structure of the display portion of the liquid crystal display device of one embodiment of the present invention. FIG. 3B is a top view illustrating the arrangement of a pixel in the display portion and signal lines between which the pixel is provided. FIGS. 4A and 4B are schematic views showing the polarities of image signals that are written into pixels in the display portion of the liquid crystal display device of one embodiment of the present invention.

The method for driving a liquid crystal display device exemplified in this embodiment is a method for driving the liquid crystal display device exemplified in Embodiment 2.

In a first step, a selection signal is input to one scan line (e.g., the scan line G2), so that pixels electrically connected to the scan line are selected from the plurality of pixels 100.

Then, in a second step, image signals having alternating opposite polarities are input to a first signal line and a second signal line (e.g., the signal lines S1 and S2) arranged with a pixel provided therebetween, so that the image signals having opposite polarities are sequentially written into the selected plurality of pixels.

The method for driving the liquid crystal display device described as an example in this embodiment includes the first step of selecting a plurality of pixels electrically connected to one scan line and the second step of sequentially writing image signals having alternating opposite polarities into the selected plurality of pixels. In this method, the potentials of a pair of signal lines change in opposite polarity directions, whereby the fluctuation of the potential of a pixel electrode can be cancelled out; thus, crosstalk can be reduced. Consequently, a method for driving a liquid crystal display device whose power consumption is reduced while image quality is prevented from being degraded can be provided.

<Crosstalk>

Crosstalk refers to a phenomenon in which when the potential of a signal line is changed in the period during which the potential of an image signal is held, the potential of a pixel electrode fluctuates accordingly. Crosstalk causes degradation of display contrast.

Crosstalk is caused by parasitic capacitance that is formed between a signal line for inputting an image signal to a pixel and a pixel electrode included in a liquid crystal element.

FIG. 3B illustrates a structure of the pixels 100 in one column, which are connected to a signal line Si (i is any number of 1 to x−1). Note that FIG. 3B illustrates a pixel electrode 104 included in the liquid crystal element 103, instead of the liquid crystal element 103 illustrated in FIG. 3A.

In the pixel 100 to which the signal line Si is connected, the pixel electrode 104 is positioned between the signal line Si and a signal line Si+1 that is adjacent to the signal line Si. If the transistor 102 is off, it is ideal that the pixel electrode 104 and the signal line Si are electrically separated from each other. Further, ideally, the pixel electrode 104 and the signal line Si+1 are electrically separated from each other. However, there actually exist a parasitic capacitance 106 between the pixel electrode 104 and the signal line Si, and a parasitic capacitance 107 between the pixel electrode 104 and the signal line Si+1.

In the case where a capacitor is not connected to the liquid crystal element 103, or in the case where a capacitor connected to the liquid crystal element 103 has a small capacitance, the potential of the pixel electrode 104 is easily affected by the parasitic capacitance 106 and the parasitic capacitance 107. Therefore, even when the transistor 102 is in an off state in a period during which a potential of an image signal is held, there easily occurs a phenomenon called crosstalk in which the potential of the pixel electrode 104 fluctuates in accordance with the change in the potential of the signal line Si or the signal line Si+1. Therefore, in the case of using normally-white liquid crystal for the liquid crystal element 103, images are whitish and the contrast is low.

<Source Line Inversion and Dot Inversion>

In one embodiment of the present invention, image signals having opposite polarities are input to the signal line Si and the signal line Si+1 arranged with the pixel electrode 104 provided therebetween, in one given frame period.

Note that the "image signals having opposite polarities" means, on the assumption that the potential of a common electrode of the liquid crystal element is a reference potential, an image signal having a potential higher than the reference potential and an image signal having a potential lower than the reference potential.

Two methods (source line inversion and dot inversion) can be given as examples of a method for sequentially writing image signals having alternating opposite polarities into a plurality of pixels which are selected. In either method, the potentials of a pair of signal lines change in opposite polarity directions, whereby the fluctuation of the potential of a pixel electrode can be cancelled out. Therefore, crosstalk can be reduced.

Source line inversion is a method in which image signals having opposite polarities are input in one given frame period so that the polarity of image signals input to a plurality of pixels connected to one signal line and the polarity of image signals input to a plurality of pixels connected to a signal line that is adjacent to the above signal line are opposite to each other.

FIG. 4A schematically shows polarities of image signals supplied to pixels in the case of source line inversion driving. In FIG. 4A, "+" indicates a pixel to which an image signal having a positive polarity is supplied in one given frame period, and "−" indicates a pixel to which an image signal having a negative polarity is supplied in the given frame period. The frame on the right side of FIG. 4A is a frame following the frame on the left side.

In the source line inversion driving, image signals having the same polarity are supplied to all of plural pixels connected to the same signal line. In addition, image signals having the polarity opposite to the above polarity are supplied to all of plural pixels connected to the adjacent signal line.

Dot inversion is a method in which image signals having opposite polarities are input in one given frame period so that the polarity of image signals input to a plurality of pixels connected to one signal line and the polarity of image signals input to a plurality of pixels connected to a signal line adjacent to the above signal line are opposite to each other and, in addition, so that in the plurality of pixels connected to the one signal line, the polarity of an image signal input to a pixel and the polarity of an image signal input to a pixel adjacent to the pixel are opposite to each other.

FIG. 4B schematically shows polarities of image signals supplied to pixels in the case of dot inversion driving. In FIG. 4B, "+" indicates a pixel to which an image signal having a positive polarity is supplied in one given frame period, and "−" indicates a pixel to which an image signal having a negative polarity is supplied in the given frame period. The frame on the right side of FIG. 4B is a frame following the frame on the left side.

In the dot inversion driving, the polarity of image signals supplied to a plurality of pixels connected to one signal line is opposite to the polarity of image signals supplied to a plurality of pixels connected to a signal line adjacent to the signal line. In addition, in a plurality of pixels connected to one signal line, the polarity of an image signal supplied to a pixel is opposite to the polarity of an image signal supplied to a pixel adjacent to the pixel. That is, when focusing on one frame period, the polarity of an image signal input to one signal line is inverted alternately.

In either method, an image signal having a positive (+) polarity is input to the signal line Si and an image signal having a negative (−) polarity is input to the signal line Si+1. Next, an image signal having a negative (−) polarity is input to the signal line Si and an image signal having a positive (+) polarity is input to the signal line Si+1. Then, an image signal having a positive (+) polarity is input to the signal line Si and an image signal having a negative (−) polarity is input to the signal line Si+1.

When image signals having polarities opposite to each other are input to the signal line Si and the signal line Si+1 in this manner, a fluctuation in the potential of the pixel electrode 104 which is caused by a change in the potential of the signal line Si and a fluctuation in the potential of the pixel electrode 104 which is caused by a change in the potential of the signal line Si+1 work in opposite directions and are balanced out.

As a result, even in the case where the pixel 100 has a relatively small capacitance, the fluctuation in the potential of the pixel electrode 104 can be small. Accordingly, crosstalk is reduced and the image quality can be improved.

<Timing Chart>

FIG. 5 is a timing chart in the case of operating a display portion 101 illustrated in FIG. 3A by source line inversion driving. Specifically, FIG. 5 shows changes over time of the potential of a signal supplied to the scan line G1, the potentials of image signals supplied to the signal lines S1 to Sx, and the potentials of the pixel electrodes included in pixels connected to the scan line G1.

First, the scan line G1 is selected by inputting a signal with a pulse to the scan line G1. In each of the plurality of pixels 100 connected to the selected scan line G1, the transistor 102 is turned on. When a potential of an image signal is supplied to the signal lines S1 to Sx in the state where the transistor 102 is on, the potential of the image signal is supplied to the pixel electrode of the liquid crystal element 103 via the on-state transistor 102.

In the timing chart of FIG. 5, an example is shown in which, in a period during which the scan line G1 is selected in the first frame period, image signals having a positive polarity are sequentially input to the odd-numbered signal lines S1, S3, . . . and image signals having a negative polarity are sequentially input to the even-numbered signal lines S2, S4, . . . Sx. Therefore, image signals having a positive polarity are supplied to the pixel electrodes (S1), (S3), . . . in the pixels 100 which are connected to the odd-numbered signal lines S1, S3, . . . . . Further, image signals having a negative polarity are supplied to the pixel electrodes (S2), (S4), . . . (Sx) in the pixels 100 connected to the even-numbered signal lines S2, S4, . . . Sx.

In the liquid crystal element 103, the alignment of liquid crystal molecules is changed in accordance with the level of the voltage applied between the pixel electrode and the common electrode, whereby transmittance is changed. Accordingly, the transmittance of the liquid crystal element 103 can be controlled by the potential of the image signal; thus, gradation can be displayed.

When input of image signals to the signal lines S1 to Sx is completed, the selection of the scan line G1 is terminated. When the selection of the scan line is terminated, the transistors 102 are turned off in the pixels 100 connected to the scan line. Then, voltage applied between the pixel electrode and the common electrode is held in the liquid crystal element 103, whereby display of gradation is maintained. Further, the scan lines G2 to Gy are sequentially selected, and operations similar to that in the period during which the scan line G1 is selected are performed in the pixels connected to the above respective scan lines.

Next, the scan line G1 is selected again in the second frame period. In a period during which the scan line G1 is selected in the second frame period, image signals having a negative polarity are sequentially input to the odd-numbered signal lines S1, S3, . . . and image signals having a positive polarity are sequentially input to the even-numbered signal lines S2, S4, . . . Sx, unlike the period during which the scan line G1 is selected in the first frame period. Therefore, image signals having a negative polarity are supplied to the pixel electrodes (S1), (S3), . . . in the pixels 100 which are connected to the odd-numbered signal lines S1, S3, . . . . . Further, image signals having a positive polarity are supplied to the pixel electrodes (S2), (S4), . . . (Sx) in the pixels 100 connected to the even-numbered signal lines S2, S4, . . . Sx.

Also in the second frame period, when input of image signals to the signal lines S1 to Sx is completed, the selection of the scan line G1 is terminated. Further, the scan lines G2 to Gy are sequentially selected, and operations similar to that in the period during which the scan line G1 is selected are performed in the pixels connected to the above respective scan lines.

An operation similar to the above is repeated in the third frame period and the fourth frame period.

Although an example in which image signals are sequentially input to the signal lines S1 to Sx is shown in the timing chart of FIG. 5, one embodiment of the present invention is not limited to this structure. Image signals may be input to the signal lines S1 to Sx all at once, or image signals may be sequentially input per plural signal lines.

In this embodiment, the scan line is selected by progressive scan; however, interlace scan may also be employed for selecting a scan line.

By inversion driving in which the polarity of the potential of an image signal is inverted using the reference potential of a common electrode as a reference, degradation of liquid crystal called burn-in can be prevented.

However, in the inversion driving, the change in the potential supplied to the signal line is increased at the time of changing the polarity of the image signal; thus, a potential difference between a source electrode and a drain electrode of the transistor 102 which functions as a switching element is increased. Accordingly, degradation of characteristics, such as a shift of threshold voltage, is easily caused in the transistor 102.

Furthermore, in order to maintain the voltage held in the liquid crystal element 103, the off-state current of the transistor 102 needs to be low even when the potential difference between the source electrode and the drain electrode is large.

In one embodiment of the present invention, a semiconductor which has a wider band gap and a lower intrinsic carrier density than silicon or germanium, such as an oxide semiconductor, is used for the transistor 102; therefore, the withstand voltage of the transistor 102 can be increased and the off-state current can be made extremely low. Therefore, as compared to the case of using a transistor including a normal semiconductor material such as silicon or germanium, deterioration of the transistor 102 can be prevented and the voltage held in the liquid crystal element 103 can be maintained.

Note that the response time of liquid crystal from application of voltage to saturation of the change in transmittance is generally about ten milliseconds. Thus, a change in the transmittance of a liquid crystal element tends to be recognized as a blur of a moving image. As a countermeasure, in one embodiment of the present invention, overdriving may be employed in which the voltage applied to the liquid crystal element 103 is temporarily increased so that the alignment of liquid crystal changes quickly. By overdriving, a change in the transmittance of a liquid crystal element becomes less likely to be recognized as a blur of a moving image, and the quality of a moving image can be improved.

Further, if the transmittance of the liquid crystal element keeps changing without reaching a constant value after the transistor 102 is turned off, the permittivity of the liquid crystal also changes; accordingly, the voltage held in the liquid crystal element easily changes. In particular, as in one embodiment of the present invention, in the case where a capacitor is not connected in parallel to the liquid crystal element or in the case where a capacitor connected in parallel to the liquid crystal element has a small capacitance, the above-described change in the voltage held in the liquid crystal element tends to occur remarkably. However, by the overdriving, the response time can be shortened and therefore the change in the transmittance of the liquid crystal element after the transistor 102 is turned off can be made small. Accordingly, even in the case where a capacitor is not connected in parallel to the liquid crystal element or even in the case where a capacitor connected in parallel to the liquid crystal element has a small capacitance, the change in the voltage held in the liquid crystal element after turning off the transistor 102 can be prevented.

Note that this embodiment can be combined with any of the other embodiments in this specification as appropriate.

Embodiment 4

In this embodiment, one embodiment of a structure of a transistor which is applicable to a liquid crystal display device of one embodiment of the present invention and a method for manufacturing the transistor will be described with reference to FIGS. 6A to 6C and FIGS. 7A to 7D. Specifically, the transistor can be used as the transistor 312 in the display portion of the liquid crystal display device described in Embodiment 1.

Figure 6A:
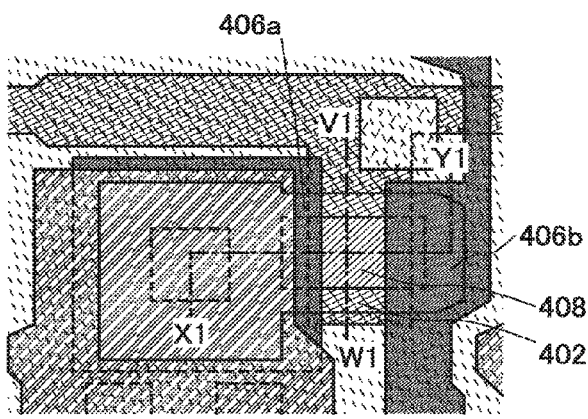
FIGS. 6A to 6C illustrate a structure of a transistor which is applicable to a liquid crystal display device according to one embodiment.
Figure 6C:
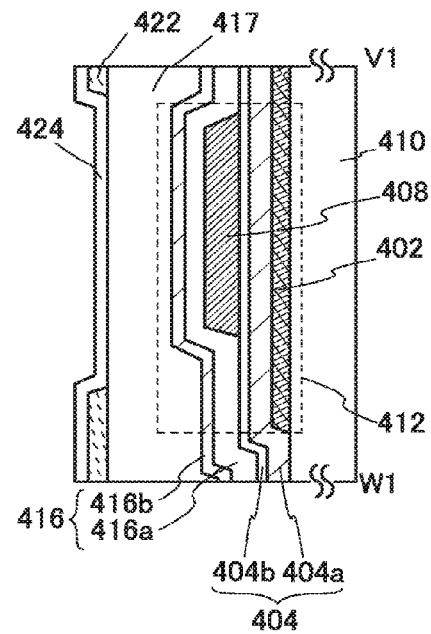
Figure 6B:
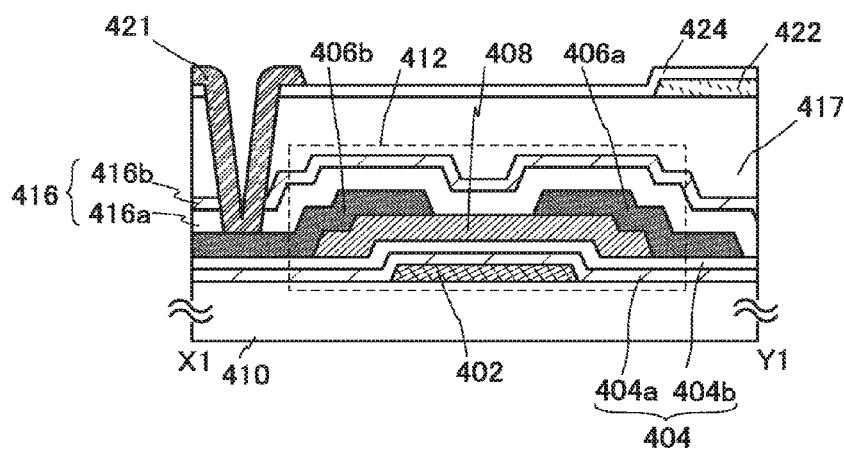

FIG. 6A is a plan view of a structure of a bottom-gate transistor 412 which is applicable to a liquid crystal display device of one embodiment of the present invention, FIG. 6B is a cross-sectional view taken along line X1-Y1 in FIG. 6A, and FIG. 6C is a cross-sectional view taken along line V1-W1 in FIG. 6A. FIGS. 7A to 7D are cross-sectional views illustrating a method for manufacturing the transistor 412.

The transistor 412 in FIGS. 6A to 6C includes a gate electrode layer 402 over a substrate 410 having an insulating surface, a gate insulating layer 404 over the gate electrode layer 402, an oxide semiconductor layer 408 which is in contact with the gate insulating layer 404 and overlaps with the gate electrode layer 402, and a source or drain electrode layer 406a and a source or drain electrode layer 406b which are electrically connected to the oxide semiconductor layer 408.

Further, an insulating layer 416 which covers the source or drain electrode layer 406a and the source or drain electrode layer 406b and is in contact with the oxide semiconductor layer 408 may be included as a component of the transistor 412. The channel length of the transistor 412 can be, for example, 1 µm or more.

An insulating layer 417 planarizes unevenness which is caused by a structure (e.g., the transistor 412) formed over the substrate 410. A common electrode 422 is formed over the insulating layer 417, and an insulating film 424 is formed over the common electrode 422. A pixel electrode 421 is electrically connected to the source or drain electrode layer 406b of the transistor 412 through an opening provided in the insulating film 424, the insulating layer 417, and the insulating layer 416.

The structure exemplified in this embodiment includes oxygen-containing insulating layers (each of which is a silicon oxide layer, a silicon oxide layer containing nitrogen, or the like) as insulating layers (a gate insulating layer 404b and an insulating layer 416a) which are in contact with the oxide semiconductor layer 408. Thus, oxygen can be supplied to the oxide semiconductor layer 408 to fill oxygen vacancies in the oxide semiconductor layer 408.

The structure also includes silicon nitride films as insulating layers (a gate insulating layer 404a and an insulating layer 416b) which are provided above and below the oxide semiconductor layer 408 to be in contact with the oxygen-containing insulating layers. The silicon nitride films each function as a blocking film which prevents hydrogen or a compound containing hydrogen (e.g., water) from entering the oxide semiconductor layer 408. Accordingly, with such a stacked-layer structure, the reliability of the transistor can be improved.

Elements included in a transistor which is applicable to a liquid crystal display device of one embodiment of the present invention are described below.

<Gate Insulating Layer>

In this embodiment, the gate insulating layer 404 is a stack of the gate insulating layer 404a which is in contact with the gate electrode layer 402 and the gate insulating layer 404b which is over the gate insulating layer 404a and in contact with the oxide semiconductor layer 408.

<Insulating Layer>

The insulating layer 416 is a stack of the insulating layer 416a which is in contact with the source or drain electrode layer 406a and the source or drain electrode layer 406b and the insulating layer 416b which is over the insulating layer 416a.

<Oxide Semiconductor Layer>

The oxide semiconductor layer 408 is in a single crystal state, a polycrystalline (also referred to as polycrystal) state, an amorphous state, or the like. Note that the oxide semiconductor layer 408 is preferably a CAAC-OS (c-axis aligned crystalline oxide semiconductor) film. A structure in which a CAAC-OS film is used as the oxide semiconductor layer 408 is described in detail in Embodiment 5.

An oxide semiconductor used for the oxide semiconductor layer 408 contains at least indium (In). In particular, indium and zinc (Zn) are preferably contained. In addition, as a stabilizer for reducing the variation in electrical characteristics of a transistor using the oxide semiconductor, gallium (Ga) is preferably additionally contained. It is preferable that one or more elements selected from tin (Sn), hafnium (Hf), aluminum (Al), and zirconium (Zr) be contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, zinc oxide, a two-component metal oxide such as an In—Zn-based oxide, an In—Mg-based oxide, or an In—Ga-based oxide, a three-component metal oxide such as an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

For example, an "In—Ga—Zn-based oxide" means an oxide containing In, Ga, and Zn as its main components and there is no particular limitation on the ratio of In, Ga, and Zn. The In—Ga—Zn-based oxide may contain a metal element other than the In, Ga, and Zn.

A material represented by $InMO_3(ZnO)_m$ (m>0, m is not an integer) may be used as the oxide semiconductor. Note that M represents one or more metal elements selected from Ga, Fe, Mn, and Co. Alternatively, a material represented by $In_2SnO_5(ZnO)_n$ (n>0, n is an integer) may be used as the oxide semiconductor.

For example, an In—Ga—Zn-based oxide with an atomic ratio of In:Ga:Zn=1:1:1 (=1/3:1/3:1/3), In:Ga:Zn=2:2:1 (=2/5:2/5:1/5), or In:Ga:Zn=3:1:2 (=1/2:1/6:1/3), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, an oxide semiconductor containing indium that is included in a transistor is not limited to the materials given above; a material with an appropriate composition may be used for a transistor including an oxide semiconductor containing indium depending on necessary electrical characteristics (e.g., field-effect mobility, threshold voltage, and variation). In order to obtain necessary electrical characteristics, it is preferable that the carrier concentration, the impurity concentration, the defect density, the atomic ratio of a metal element to oxygen, the interatomic distance, the density, and the like be set as appropriate.

For example, high field-effect mobility can be obtained relatively easily in a transistor including an In—Sn—Zn-based oxide. Also in the case of a transistor including an In—Ga—Zn-based oxide, the field-effect mobility can be increased by reducing the defect density in a bulk.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor layer can be formed by a sputtering method. Generation of particles in deposition can be reduced by using a sputtering target containing indium. Therefore, the oxide semiconductor layer containing indium is preferable.

<Method for Manufacturing Transistor>

An example of a method for manufacturing the transistor 412 is described below with reference to FIGS. 7A to 7D.

<<Gate Electrode Layer>>

First, the gate electrode layer 402 (including a wiring formed using the same layer) is formed over the substrate 410 having an insulating surface.

There is no particular limitation on the substrate that can be used as the substrate 410 having an insulating surface as long as it has heat resistance high enough to withstand heat treatment performed later. For example, a glass substrate of barium borosilicate glass, aluminoborosilicate glass, or the like, a ceramic substrate, a quartz substrate, or a sapphire substrate can be used. Alternatively, a single crystal semiconductor substrate or a polycrystalline semiconductor substrate made of silicon, silicon carbide, or the like, a compound semiconductor substrate made of silicon germanium or the like, an SOI substrate, or the like can be used. Furthermore, any of these substrates provided with a semiconductor element may be used as the substrate 410. A base insulating layer may be formed over the substrate 410.

The gate electrode layer 402 can be formed using a metal material such as molybdenum, titanium, tantalum, tungsten, aluminum, copper, chromium, neodymium, or scandium, or an alloy material containing any of these materials as a main component. Alternatively, a semiconductor film typified by a polycrystalline silicon film doped with an impurity element such as phosphorus, or a silicide film such as a nickel silicide film may be used as the gate electrode layer 402. The gate electrode layer 402 may have either a single-layer structure or a stacked-layer structure. The gate electrode layer 402 may have a tapered shape with a taper angle of greater than or equal to 15° and less than or equal to 70° for example. Here, the taper angle refers to an angle formed between a side surface of a layer having a tapered shape and a bottom surface of the layer.

The material of the gate electrode layer 402 may be a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added.

Alternatively, as the material of the gate electrode layer 402, an In—Ga—Zn-based oxide containing nitrogen, an In—Sn-based oxide containing nitrogen, an In—Ga-based oxide containing nitrogen, an In—Zn-based oxide containing nitrogen, an Sn-based oxide containing nitrogen, an In-based oxide containing nitrogen, or a metal nitride film (such as an indium nitride film, a zinc nitride film, a tantalum nitride film, or a tungsten nitride film) may be used. These materials have a work function of 5 eV or more. Therefore, when the gate electrode layer 402 is formed using any of these materials, the threshold voltage of the transistor can be positive, so that the transistor can be a normally-off switching transistor.

<<Gate Insulating Layer>>

Figure 7A:
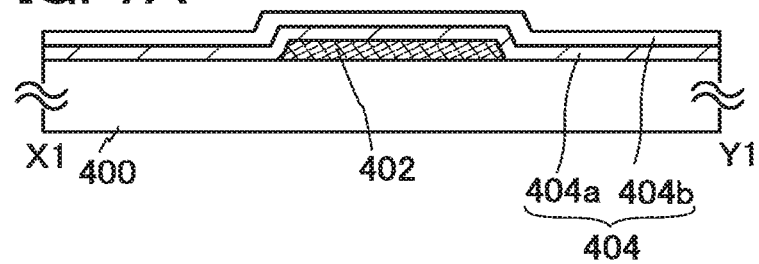
FIGS. 7A to 7D illustrate manufacturing steps of a transistor which is applicable to a liquid crystal display device according to one embodiment.

Next, the gate insulating layer 404 is formed so as to cover the gate electrode layer 402 (see FIG. 7A). As the gate insulating layer 404, a single layer or a stack of layers including at least one of the following films formed by a plasma CVD method, a sputtering method, or the like is used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

Note that in the gate insulating layer 404, a region (the gate insulating layer 404b in this embodiment) in contact with the oxide semiconductor layer 408 to be formed later is preferably an oxygen-containing insulating layer, and more preferably has a region containing oxygen in excess of the stoichiometric composition (an oxygen-excess region). In order to provide the oxygen-excess region in the gate insulating layer 404, for example, the gate insulating layer 404 may be formed in an oxygen atmosphere. Alternatively, oxygen may be introduced into the formed gate insulating layer 404 to provide the oxygen-excess region. Oxygen can be introduced by an ion implantation method, an ion doping method, a plasma immersion ion implantation method, plasma treatment, or the like.

In this embodiment, a silicon nitride film is formed as the gate insulating layer 404a, and a silicon oxide film is formed as the gate insulating layer 404b.

<<Oxide Semiconductor Layer>>

Figure 7B:
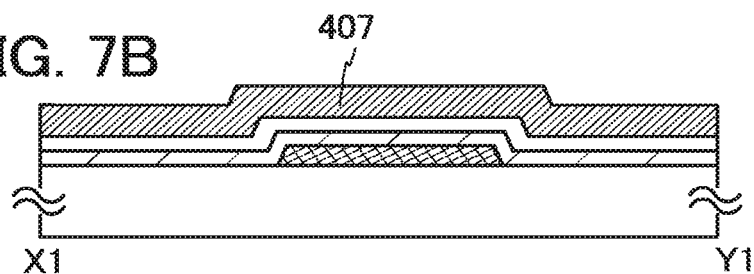

Next, an oxide semiconductor film 407 is formed over the gate insulating layer 404 (see FIG. 7B).

The oxide semiconductor film 407 can be formed by a sputtering method, a molecular beam epitaxy (MBE) method, a CVD method, a pulse laser deposition method, an atomic layer deposition (ALD) method, or the like as appropriate.

The gate insulating layer 404 and the oxide semiconductor film 407 are preferably formed in succession without exposure to the air. By forming the gate insulating layer 404 and the oxide semiconductor film 407 in succession without exposure to the air, attachment of hydrogen or a hydrogen compound (e.g., adsorption water) onto a surface of the oxide semiconductor film 407 can be prevented, and thus mixing of an impurity can be prevented.

A sputtering target which is polycrystalline and has a high relative density (a high filling rate) is used as a sputtering target for forming the oxide semiconductor film. The oxide semiconductor film is formed under the following conditions: the sputtering target in deposition is sufficiently cooled to room temperature; the temperature of a surface of a deposition-target substrate where the oxide semiconductor film is to be formed is increased to room temperature or higher, and an atmosphere in a deposition chamber hardly contains moisture or hydrogen.

The higher density of the sputtering target is more preferable. When the density of the sputtering target is increased, the density of a film to be deposited can also be increased. Specifically, the relative density (filling rate) of the sputtering target is set to be higher than or equal to 90% and lower than or equal to 100%, preferably higher than or equal to 95%, more preferably higher than or equal to 99.9%. Note that the relative density of the sputtering target refers to a ratio of the density of the sputtering target to the density of a material free of porosity having the same composition as the sputtering target.

The sputtering target is preferably sintered in an inert gas atmosphere (a nitrogen atmosphere or a rare gas atmosphere), in vacuum, or in a high-pressure atmosphere. As a sintering method, an atmospheric sintering method, a pressure sintering method, or the like can be used as appropriate. A polycrystalline target obtained by any of these methods is used as a sputtering target. A hot pressing method, a hot isostatic pressing (HIP) method, a discharge plasma sintering method, or an impact method is preferably used as a pressure sintering method. The maximum temperature at which sintering is performed is selected depending on the sintering temperature of the sputtering target material, and it is preferably set to approximately 1000° C. to 2000° C., or more preferably, 1200° C. to 1500° C. The holding time of the maximum temperature is selected depending on the sputtering target material, and 0.5 hours to 3 hours is preferable.

In the case of forming an In—Ga—Zn-based oxide film, a target having an atomic ratio of In:Ga:Zn=3:1:2, a target having an atomic ratio of In:Ga:Zn=1:1:1, or the like is used as the sputtering target.

To obtain a dense film, it is important to reduce impurities which remain in the deposition chamber. The back pressure (ultimate vacuum: degree of vacuum before introduction of a reaction gas) in the deposition chamber is set to be lower than or equal to $5\times10^{-3}$ Pa, preferably lower than or equal to $6\times10^{-5}$ Pa, and the pressure in deposition is set to be lower than 2 Pa, preferably lower than or equal to 0.4 Pa. When the back pressure is set to be low, impurities in the deposition chamber are reduced.

To obtain a dense film, it is also important to reduce impurities contained in a gas that is introduced into the deposition chamber, i.e., a gas used at the deposition. Further, it is important to increase the proportion of oxygen contained in the deposition gas and optimize power. By increasing the proportion of oxygen (the upper limit: 100% oxygen) in the deposition gas and optimizing the power, plasma damage in deposition can be alleviated. Thus, a dense film is easily obtained.

Deposition of the oxide semiconductor film is preferably performed while a quadrupole mass analyzer (hereinafter also referred to as Q-mass) is operated continuously in order that the amount of moisture in the deposition chamber, or the like is monitored by the Q-mass before or in deposition.

For example, in the case where the oxide semiconductor film 407 is formed by a sputtering method, oxygen or a mixed gas of oxygen and a high-purity rare gas from which impurities such as hydrogen, water, a hydroxyl group, and a hydride have been removed is used as a deposition gas supplied to a deposition chamber of a sputtering apparatus.

Note that heat treatment for dehydration or dehydrogenation may be performed as appropriate on the formed oxide semiconductor film 407. Further, oxygen may be supplied to the oxide semiconductor film 407 which has been subjected to dehydration or dehydrogenation treatment.

Figure 7C:
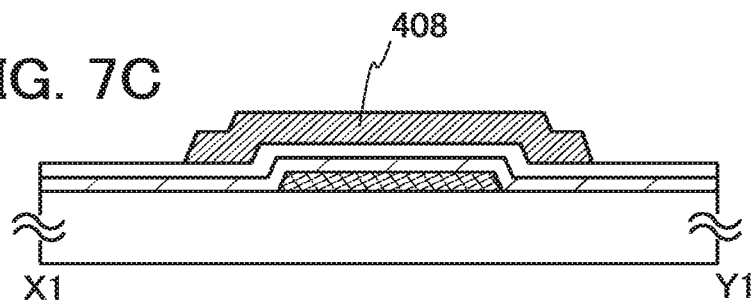

Next, the oxide semiconductor film 407 is processed by etching treatment using a photolithography method into the island-shaped oxide semiconductor layer 408 (see FIG. 7C).

<<Source Electrode Layer and Drain Electrode Layer>>

Then, a conductive film is formed over the oxide semiconductor layer 408 and processed to form the source or drain electrode layer 406a and the source or drain electrode layer 406b (including a wiring formed using the same layer).

For the source or drain electrode layer 406a and the source or drain electrode layer 406b, a metal film containing an element selected from Al, Cr, Cu, Ta, Ti, Mo, and W, a metal nitride film containing any of the above elements as a component (a titanium nitride film, a molybdenum nitride film, or a tungsten nitride film), or the like can be used, for example. Alternatively, a film of a high-melting-point metal such as Ti, Mo, or W or a metal nitride film of any of these elements (a titanium nitride film, a molybdenum nitride film, or a tungsten nitride film) may be stacked on one of or both a bottom side and a top side of a metal film of Al, Cu, or the like. Further alternatively, the source or drain electrode layer 406a and the source or drain electrode layer 406b may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials in which silicon oxide is contained can be used.

For the source or drain electrode layer 406a and the source or drain electrode layer 406b, a metal nitride film such as an In—Ga—Zn—O film containing nitrogen, an In—Sn—O film containing nitrogen, an In—Ga—O film containing nitrogen, an In—Zn—O film containing nitrogen, a Sn—O film containing nitrogen, or an In—O film containing nitrogen can be used. These films contain the same constituent elements as the oxide semiconductor layer 408 and can therefore stabilize the interface with the oxide semiconductor layer 408.

<<Insulating Layer>>

Figure 7D:
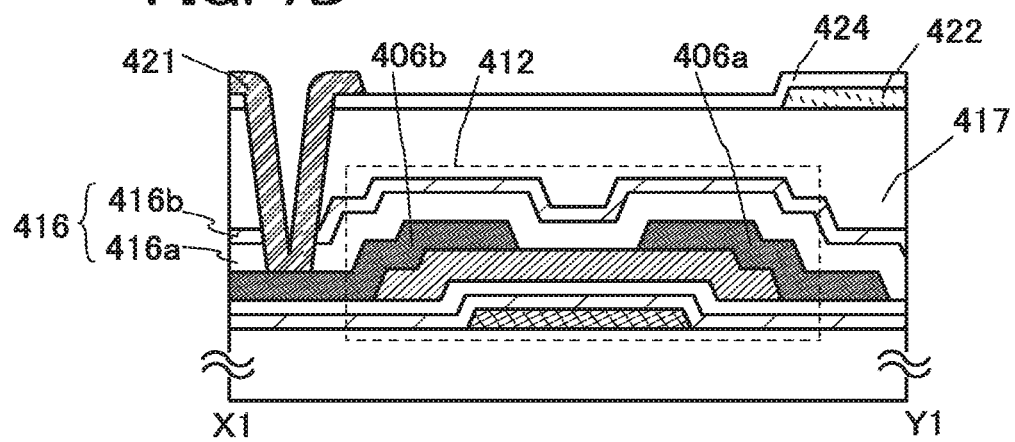

Next, the insulating layer 416 is formed to cover the source or drain electrode layer 406a, the source or drain electrode layer 406b, and the exposed oxide semiconductor layer 408 (see FIG. 7D).

The insulating layer 416 can be formed using a single layer or a stack of layers of one or more of the following films formed by a plasma CVD method or a sputtering method: a silicon oxide film, a gallium oxide film, an aluminum oxide film, a silicon nitride film, a silicon oxynitride film, an aluminum oxynitride film, a silicon nitride oxide film, and the like. Note that it is preferable that an oxygen-containing insulating layer be formed as the insulating layer 416 (in this embodiment, the insulating layer 416a) in contact with the oxide semiconductor layer 408 because the oxygen-containing insulating layer can supply oxygen to the oxide semiconductor layer 408.

For example, a silicon oxide film or a silicon oxynitride film may be formed under the following conditions: the substrate placed in a treatment chamber of a plasma CVD apparatus, which is vacuum-evacuated, is held at a temperature higher than or equal to 180° C. and lower than or equal to 400° C., preferably higher than or equal to 200° C. and lower than or equal to 370° C., the pressure in the treatment chamber is greater than or equal to 30 Pa and less than or equal to 250 Pa, preferably greater than or equal to 40 Pa and less than or equal to 200 Pa with introduction of a source gas into the treatment chamber, and high-frequency power is supplied to an electrode provided in the treatment chamber. Under the above conditions, an oxygen-containing insulating layer into which and from which oxygen is diffused can be formed.

After the formation of the oxygen-containing insulating layer into which and from which oxygen is diffused, a silicon oxide film or a silicon oxynitride film may be formed under the following conditions: the substrate placed in a treatment chamber of the plasma CVD apparatus, which is vacuum-evacuated, without exposure to the air is held at a temperature higher than or equal to 180° C. and lower than or equal to 250° C., preferably higher than or equal to 180° C. and lower than or equal to 230° C., the pressure in the treatment chamber is greater than or equal to 100 Pa and less than or equal to 250 Pa, preferably greater than or equal to 100 Pa and less than or equal to 200 Pa with introduction of a source gas into the treatment chamber, and high-frequency power higher than or equal to 0.17 W/cm$^2$ and lower than or equal to 0.5 W/cm$^2$, preferably higher than or equal to 0.26 W/cm$^2$ and lower than or equal to 0.35 W/cm$^2$ is supplied to an electrode provided in the treatment chamber. Under the above conditions, the decomposition efficiency of the source gas in plasma is enhanced, oxygen radicals are increased, and oxidation of the source gas is promoted; thus, the oxygen content in the formed silicon oxide film or silicon oxynitride film is in excess of that in the stoichiometric composition. However, the bonding strength of silicon and oxygen is weak in the above substrate temperature range; therefore, part of oxygen is released by heating. Thus, it is possible to form an oxygen-containing insulating layer which contains oxygen in a proportion higher than that of oxygen in the stoichiometric composition and from which part of oxygen is released by heating.

Through the above steps, the transistor 412 of this embodiment can be manufactured.

<Method for Forming Common Electrode and Pixel Electrode>

The insulating layer 417 covering the transistor 412 is formed. The insulating layer 417 planarizes unevenness which is caused by a structure formed over the substrate 410. An acrylic resin, a polyimide resin, or the like can be used for the insulating layer 417, for example.

The common electrode 422 is formed over the insulating layer 417. The common electrode 422 is formed by processing a conductive film with use of a photolithography process.

The insulating film 424 is formed over the common electrode 422.

The pixel electrode 421 is formed over the insulating film 424. The insulating film 424 serves to insulate the pixel electrode 421 from the common electrode 422.

Note that the common electrode 422 and the pixel electrode 421 preferably have light-transmitting properties with respect to visible light, in which case the aperture ratio of the pixel can be increased.

Note that this embodiment can be combined with any of the other embodiments in this specification as appropriate.

Embodiment 5

In this embodiment, an example of an oxide semiconductor layer suitable for a transistor which is applicable to a liquid crystal display device of one embodiment of the present invention is described in detail with reference to drawings.

The oxide semiconductor layer is in a single crystal state, a polycrystalline (also referred to as polycrystal) state, an amorphous state, or the like.

When the temperature of a deposition-target substrate, which is an example of deposition conditions, is set to be higher than or equal to 200° C., a dense oxide semiconductor film including a crystal part, i.e., a c-axis aligned crystalline oxide semiconductor (CAAC-OS) film can be obtained.

A structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when ψ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor using the CAAC-OS film, change in electric characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

During deposition, fine sputtered particles fly from a target, and a film is formed such that the sputtered particles adhere onto the deposition-target substrate. When the temperature of the substrate is higher than or equal to 200° C., the sputtered particles are rearranged because the substrate is heated. Thus, a dense film is formed.

In the CAAC-OS film, a series of about 2 to 20 indium atoms exist in a lateral direction to form a layer including indium atoms. Note that in some cases, the layer has a series of 20 or more indium atoms; for example, the layer may have a series of 2 to 50 indium atoms, 2 to 100 indium atoms, or 2 to 500 indium atoms in a lateral direction.

Layers including indium atoms overlap with each other. The number of layers is greater than or equal to 1 and less than or equal to 20, greater than or equal to 1 and less than or equal to 10, or greater than or equal to 1 and less than or equal to 4.

As described above, a stack of the layers including indium atoms often appears to be a cluster including several indium atoms in a lateral direction and several layers in a longitudinal direction. This is because each of the sputtered particles has a flat-plate-like shape.

By increasing the temperature of the deposition-target substrate, migration of sputtered particles is likely to occur on a substrate surface. With this effect, a flat-plate-like sputtered particle reaches the substrate surface, moves slightly, and then is attached to the substrate surface with a flat plane (a-b plane) of the sputtered particle facing toward the substrate surface. Therefore, an oxide semiconductor film having a crystal region which is c-axis-aligned perpendicularly to the surface of the oxide semiconductor film is easily formed.

Further, heat treatment at a temperature higher than or equal to 200° C. may be performed after the deposition of the oxide semiconductor film, so that a denser film is obtained. However, in that case, oxygen vacancies might be generated when impurity elements (e.g., hydrogen and water) in the oxide semiconductor film are reduced. Therefore, before the heat treatment is performed, an insulating layer containing excess oxygen is preferably provided over or below the oxide semiconductor film, in which case oxygen vacancies in the oxide semiconductor film can be reduced by the heat treatment.

An oxide semiconductor film shortly after deposition is made dense; thus, a dense film which is thin and close to single crystal can be obtained. Since oxygen, hydrogen, or the like hardly diffuses within the film, a semiconductor device including the dense oxide semiconductor film can achieve improvement in reliability.

The oxide semiconductor layer included in a transistor of one embodiment of the present invention may have either an amorphous structure or a crystalline structure. Note that a CAAC-OS film is preferably used as the oxide semiconductor layer, in which case the density of states (DOS) attributed to an oxygen vacancy in the oxide semiconductor layer can be reduced.

Note that this embodiment can be combined with any of the other embodiments in this specification as appropriate.

Embodiment 6

Figure 8A:
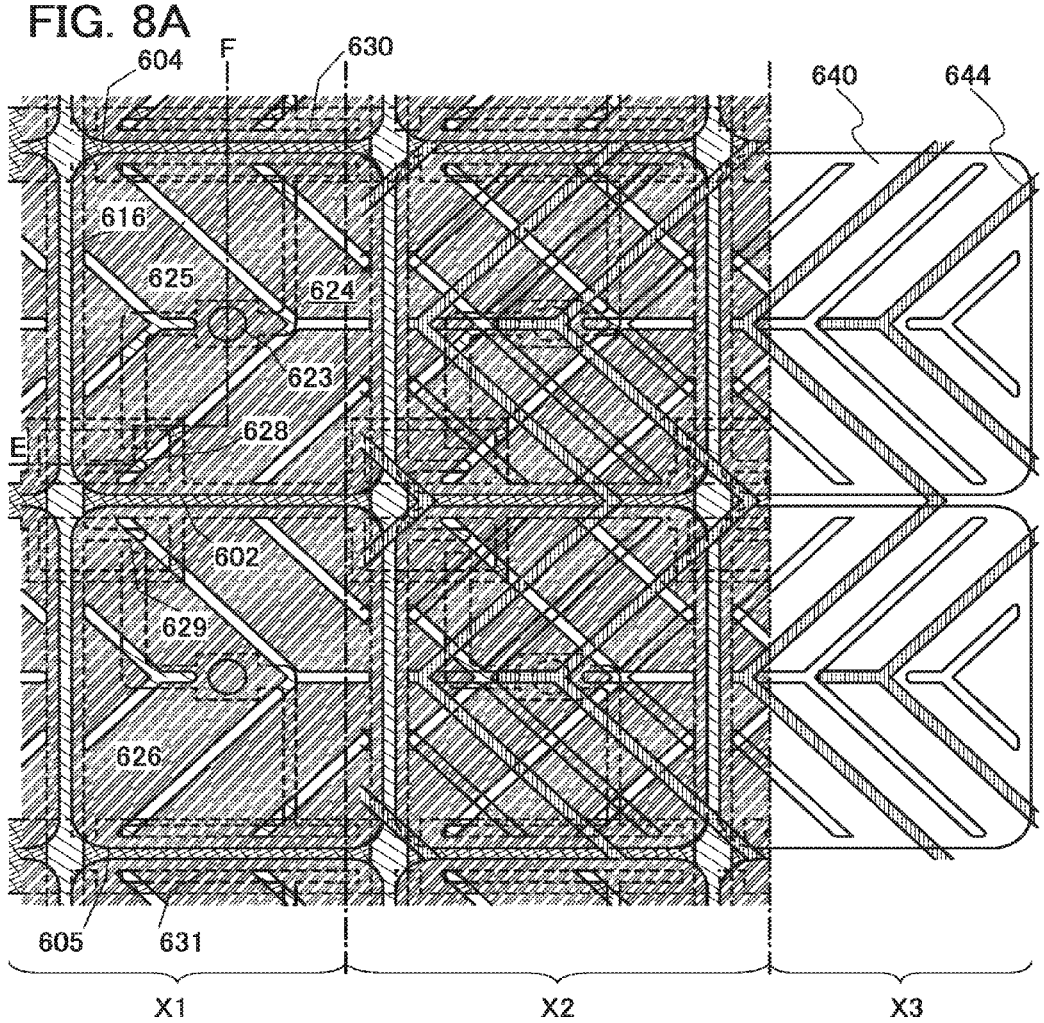
FIGS. 8A and 8B illustrate a pixel structure which is applicable to a liquid crystal display device according to one embodiment.
Figure 8B:
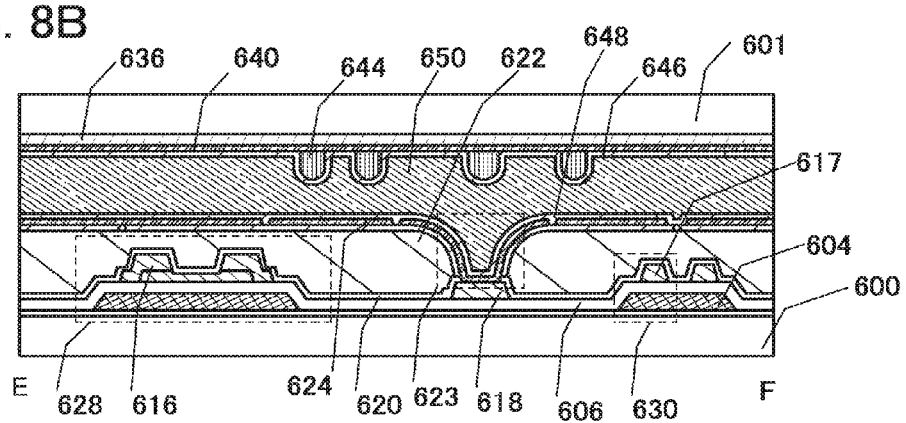
Figure 9:
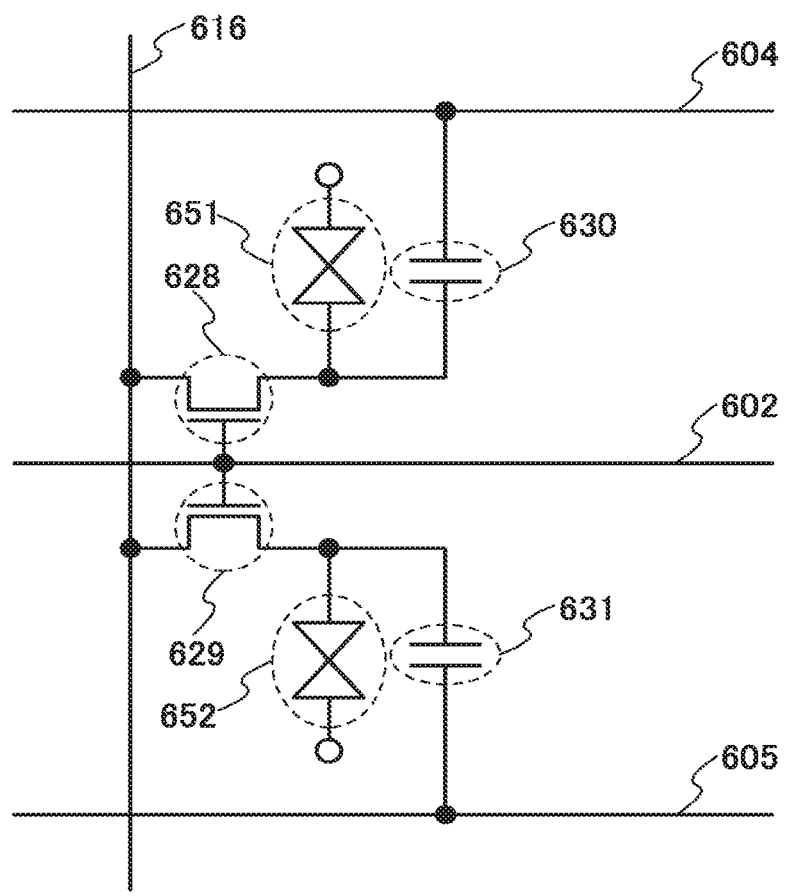
FIG. 9 is an equivalent circuit diagram illustrating a pixel structure which is applicable to a liquid crystal display device according to one embodiment.

In this embodiment, a structure of a pixel including a liquid crystal element which operates in a vertical alignment (VA) mode and can be used in a liquid crystal display device of one embodiment of the present invention is described with reference to FIGS. 8A and 8B and FIG. 9. FIG. 8A is a top view of the pixel included in the liquid crystal display device. FIG. 8B is a side view including a cross section taken along line E-F in FIG. 8A. FIG. 9 is an equivalent circuit diagram of the pixel included in the liquid crystal display device.

The VA mode is a mode for controlling alignment of liquid crystal molecules of a liquid crystal display panel. In a VA liquid crystal display device, liquid crystal molecules are aligned in a vertical direction with respect to a panel surface when no voltage is applied.

In this embodiment, in particular, a pixel is divided into some regions (subpixels), and molecules are aligned in different directions in their respective regions. This is referred to as domain multiplication or multi-domain design. A liquid crystal display device of multi-domain design is described below.

In FIG. 8A, X1 is a top view of a substrate 600 provided with a pixel electrode 624. X3 is a top view of a substrate 601 provided with a common electrode 640. X2 is a top view illustrating a state where the substrate 601 provided with the common electrode 640 is overlapped with the substrate 600 provided with the pixel electrode 624.

A transistor 628, the pixel electrode 624 connected thereto, and a storage capacitor portion 630 are formed over the substrate 600. The transistor 628, a wiring 618, and the storage capacitor portion 630 are covered with an insulating layer 620 and an insulating layer 622 over the insulating layer 620. The pixel electrode 624 is connected to the wiring 618 through a contact hole 623 that penetrates the insulating layer 620 and the insulating layer 622.

The storage capacitor portion 630 includes a first capacitor wiring 604 which is formed concurrently with a gate wiring 602 of the transistor 628; a gate insulating layer 606; and a second capacitor wiring 617 which is formed concurrently with a wiring 616 and the wiring 618.

The pixel electrode 624 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added.

The pixel electrode 624 is provided with slits 625. The slits 625 serve to control alignment of the liquid crystal.

A transistor 629, a pixel electrode 626 connected thereto, and a storage capacitor portion 631 can be formed in manners similar to those for the transistor 628, the pixel electrode 624, and the storage capacitor portion 630, respectively. Both the transistors 628 and 629 are connected to the wiring 616. A pixel of this liquid crystal display panel includes the pixel electrodes 624 and 626. The pixel electrodes 624 and 626 are subpixels.

The substrate 601 is provided with a coloring layer 636 and the common electrode 640, and protrusions 644 are formed on the common electrode 640. An alignment film 648 is formed over the pixel electrode 624. Similarly, an alignment film 646 is formed on the common electrode 640 and the protrusions 644. A liquid crystal layer 650 is formed between the substrate 600 and the substrate 601.

The common electrode 640 is preferably formed using a material similar to that of the pixel electrode 624. The protrusions 644 which control the alignment of the liquid crystal are formed on the common electrode 640.

When a voltage is applied to the pixel electrode 624 provided with the slits 625, a distorted electric field (an oblique electric field) is generated in the vicinity of the slits 625. The slits 625 and the protrusions 644 on the substrate 601 side are alternately arranged; thus, an oblique electric field is effectively generated to control alignment of the liquid crystal, so that the direction of alignment of the liquid crystal varies depending on location. That is, a viewing angle of the liquid crystal display panel is widened by domain multiplication.

FIG. 8B illustrates a state where the substrate 600 and the substrate 601 are overlapped with each other and liquid crystal is injected therebetween. The pixel electrode 624, the liquid crystal layer 650, and the common electrode 640 overlap with each other to form a liquid crystal element.

FIG. 9 illustrates an equivalent circuit of this pixel structure. Both the transistors 628 and 629 are connected to the gate wiring 602 and the wiring 616. In this case, when potentials of the capacitor wiring 604 and a capacitor wiring 605 are different from each other, operations of a liquid crystal element 651 and a liquid crystal element 652 can be different from each other. That is, alignment of the liquid crystal is precisely controlled and a viewing angle is widened by individual control of potentials of the capacitor wirings 604 and 605.

Note that this embodiment can be combined with any of the other embodiments in this specification as appropriate.

Embodiment 7

In this embodiment, a specific structure of a pixel in the case where liquid crystal exhibiting a blue phase is used for a liquid crystal layer included in a liquid crystal element will be described.

Figure 10A:
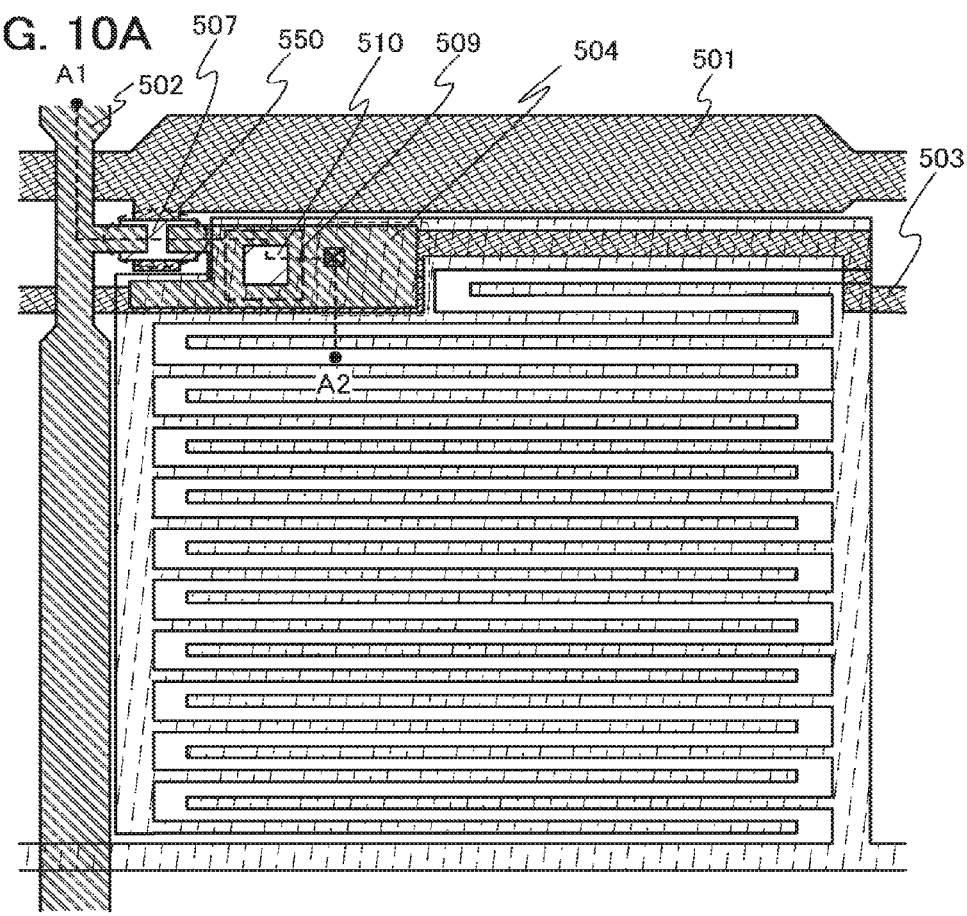
FIGS. 10A and 10B illustrate a pixel structure which is applicable to a liquid crystal display device according to one embodiment.
Figure 10B:
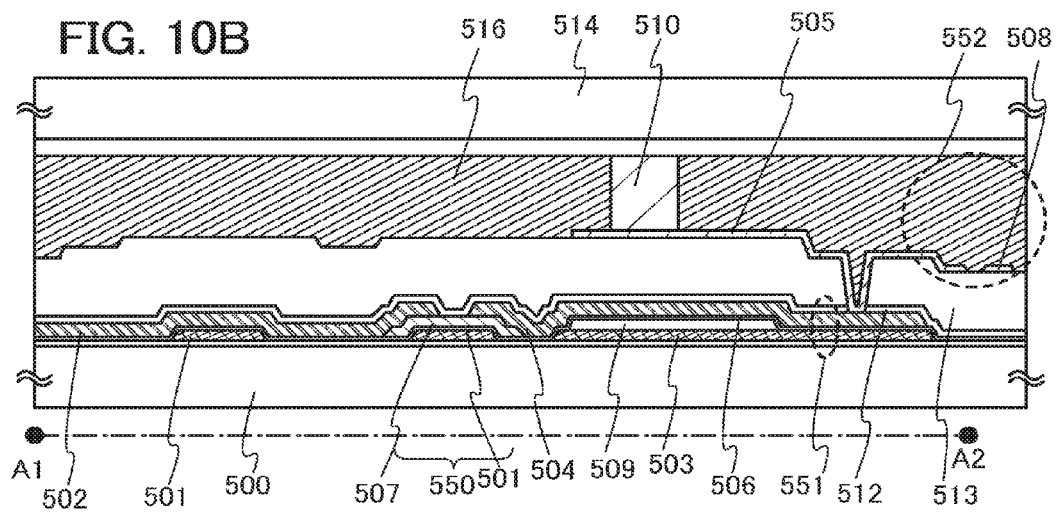

FIG. 10A is an example of a top view of a pixel. FIG. 10B is a cross-sectional view taken along broken line A1-A2 in FIG. 10A. FIG. 10A is a top view of the pixel provided with components up to a spacer 510. FIG. 10B illustrates a structure in which a substrate 514 is provided to face a substrate 500 provided with components up to the spacer 510.

The pixel illustrated in FIGS. 10A and 10B includes a conductive film 501 functioning as a scan line, a conductive film 502 functioning as a signal line, a conductive film 503 functioning as a capacitor wiring, and a conductive film 504 functioning as a second terminal of a transistor 550 functioning as a switching element. The conductive film 501 also functions as a gate electrode of the transistor 550. In addition, the conductive film 502 also functions as a first terminal of the transistor 550.

The conductive film 501 and the conductive film 503 can be formed by processing one conductive film formed over the substrate 500 having an insulating surface into a desired shape. A gate insulating film 506 is formed over the conductive film 501 and the conductive film 503. Further, the conductive film 502 and the conductive film 504 can be formed by processing one conductive film formed over the gate insulating film 506 into a desired shape.

An active layer 507 of the transistor 550 is formed over the gate insulating film 506 so as to overlap with the conductive film 501. Further, an insulating film 512 and an insulating film 513 are sequentially formed so as to cover the active layer 507, the conductive film 502, and the conductive film 504. In addition, a pixel electrode 505 and a common electrode 508 are formed over the insulating film 513, and the conductive film 504 is connected to the pixel electrode 505 through a contact hole formed in the insulating film 512 and the insulating film 513.

Note that a portion where the conductive film 503 functioning as a capacitor wiring overlaps with the conductive film 504 with the gate insulating film 506 provided therebetween functions as a capacitor 551.

In this embodiment, an insulating film 509 is formed between the conductive film 503 and the gate insulating film 506. In addition, the spacer 510 is formed over the pixel electrode 505 so as to overlap with the insulating film 509.

A liquid crystal layer 516 including liquid crystal is provided between the substrate 514, and the pixel electrode 505 and the common electrode 508. A liquid crystal element 552 is formed in a region including the pixel electrode 505, the common electrode 508, and the liquid crystal layer 516.

The pixel electrode 505 and the common electrode 508 can be formed using a light-transmitting conductive material such as indium tin oxide containing silicon oxide (ITSO), indium tin oxide (ITO), zinc oxide (ZnO), indium zinc oxide, or zinc oxide to which gallium is added (GZO), for example.

Injection of liquid crystal for formation of the liquid crystal layer 516 may be performed by a dispenser method (a dripping method) or a dipping method (a pumping method).

Note that the substrate 514 may be provided with a light-blocking film capable of blocking light so that disclination caused by disorder of alignment of the liquid crystal between pixels is prevented from being observed or dispersed light is prevented from entering a plurality of adjacent pixels. An organic resin containing black pigment such as carbon black or low-valent titanium oxide whose oxidation number is smaller than that of titanium dioxide can be used for the light-blocking film. Alternatively, a film of chromium can be used for the light-blocking film.

Like the liquid crystal element 552 illustrated in FIGS. 10A and 10B, an IPS liquid crystal element or a liquid crystal element exhibiting a blue phase has a structure including the liquid crystal layer 516 over the pixel electrode 505 and the common electrode 508. However, a liquid crystal display device according to one embodiment of the present invention may have a structure in which a liquid crystal layer is provided between a pixel electrode and a common electrode in a liquid crystal element, instead of this structure.

A transistor with extremely low off-state current can be used as the transistor 550. For example, a transistor having the structure described in Embodiment 4 can be used.

Note that this embodiment can be combined with any of the other embodiments in this specification as appropriate.

Embodiment 8

In this embodiment, electronic devices of one embodiment of the present invention will be described. Specifically, electronic devices each including a liquid crystal display device of one embodiment of the present invention will be described with reference to FIGS. 11A to 11E.

Examples of the electronic devices to which the liquid crystal display device is applied include television devices (also referred to as TV or television receivers), monitors for computers and the like, cameras such as digital cameras and digital video cameras, digital photo frames, mobile phones (also referred to as cell phones or mobile phone devices), portable game machines, portable information terminals, audio playback devices, and large game machines such as pachinko machines. Specific examples of these electronic devices are shown in FIGS. 11A to 11E.

Figure 11A:
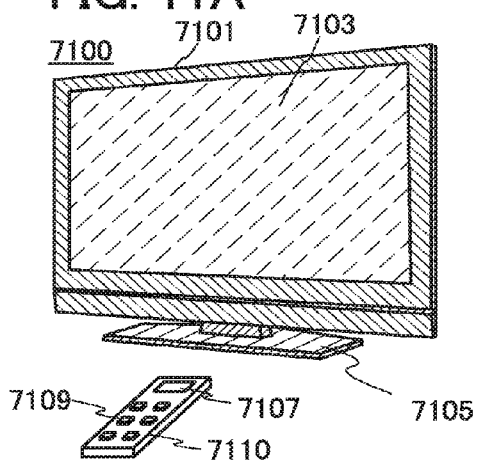
FIGS. 11A to 11E each illustrate an example of an electronic device to which a liquid crystal display device according to one embodiment can be applied.

FIG. 11A illustrates an example of a television device. In a television device 7100, a display portion 7103 is incorporated in a housing 7101. Images can be displayed on the display portion 7103, and the liquid crystal display device can be used for the display portion 7103. Here, the housing 7101 is supported by a stand 7105.

The television device 7100 can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 11B:
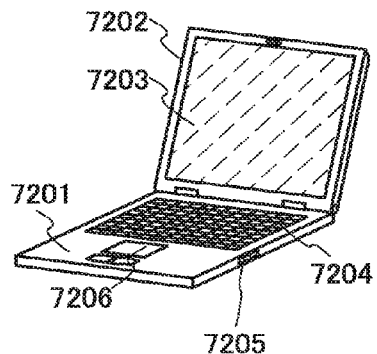

FIG. 11B illustrates a computer, which includes a main body 7201, a housing 7202, a display portion 7203, a keyboard 7204, an external connection port 7205, a pointing device 7206, and the like. This computer is manufactured by using the liquid crystal display device for the display portion 7203.

Figure 11C:
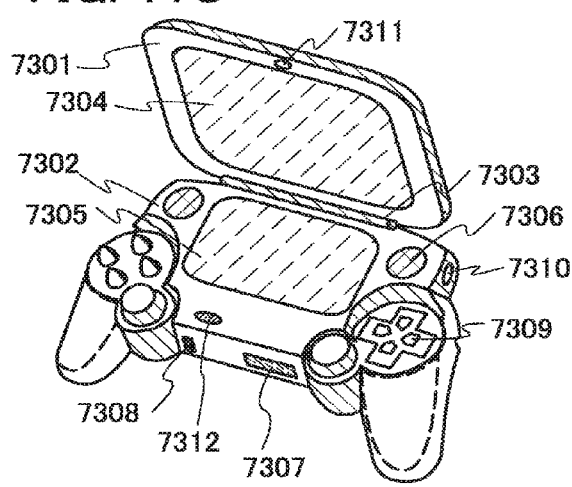

FIG. 11C illustrates a portable game machine having two housings, a housing 7301 and a housing 7302, which are connected with a joint portion 7303 so that the portable game machine can be opened or folded. A display portion 7304 is incorporated in the housing 7301 and a display portion 7305 is incorporated in the housing 7302. In addition, the portable game machine illustrated in FIG. 11C includes a speaker portion 7306, a recording medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 7312), and the like. It is needless to say that the structure of the portable game machine is not limited to the above as long as a liquid crystal display device is used for at least either the display portion 7304 or the display portion 7305, or both, and may include other accessories as appropriate. The portable game machine illustrated in FIG. 11C has a function of reading a program or data stored in a recording medium to display it on the display portion, and a function of sharing information with another portable game machine by wireless communication. The portable game machine in FIG. 11C can have a variety of functions without limitation to the above functions.

Figure 11D:
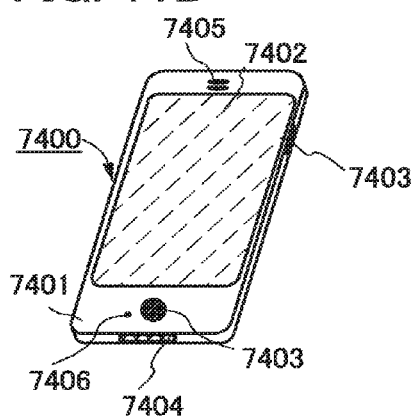

FIG. 11D illustrates an example of a mobile phone. A mobile phone 7400 is provided with a display portion 7402 incorporated in a housing 7401, operation buttons 7403, an external connection port 7404, a speaker 7405, a microphone 7406, and the like. The mobile phone 7400 is manufactured by using the liquid crystal display device for the display portion 7402.

When the display portion 7402 is touched with a finger or the like, data can be input into the mobile phone 7400 in FIG. 11D. Further, operations such as making a call and creating e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or creating e-mail, a text input mode mainly for inputting text is selected for the display portion 7402 so that text displayed on a screen can be inputted. In this case, it is preferable to display a keyboard or number buttons on almost the entire screen of the display portion 7402.

When a detection device including a sensor for detecting inclination, such as a gyroscope or an acceleration sensor, is provided inside the mobile phone 7400, display on the screen of the display portion 7402 can be automatically changed by determining the orientation of the mobile phone 7400 (whether the mobile phone is placed horizontally or vertically for a landscape mode or a portrait mode).

The screen modes are switched by touching the display portion 7402 or operating the operation buttons 7403 of the housing 7401. Alternatively, the screen modes can be switched depending on kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits a near-infrared light in the display portion, an image of a finger vein, a palm vein, or the like can be taken.

Figure 11E:
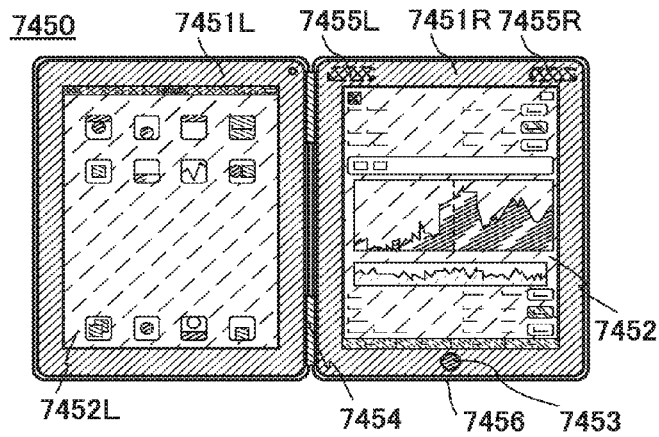

FIG. 11E illustrates an example of a folding computer. A folding computer 7450 includes a housing 7451L and a housing 7451R connected by hinges 7454. The folding computer 7450 further includes an operation button 7453, a left speaker 7455L, and a right speaker 7455R. In addition, a side surface of the folding computer 7450 is provided with an external connection port 7456, which is not illustrated. When the hinges 7454 are folded so that a display portion 7452L provided in the housing 7451L and a display portion 7452R provided in the housing 7451R face each other, the display portions can be protected by the housings.

Each of the display portions 7452L and 7452R is a component which can display images and to which information can be input by touch with a finger or the like. For example, an icon for an installed program is selected by touch with a finger so that the program can be started. Further, changing the distance between fingers touching two positions of a displayed image enables zooming in or out on the image. Drag of a finger touching one position of the displayed image enables drag and drop of the image. Selection of a displayed character or symbol on the displayed image of a keyboard by touch with a finger enables information input.

Further, the computer 7450 can also include a gyroscope, an acceleration sensor, a global positioning system (GPS) receiver, fingerprint sensor, or a video camera. For example, a detection device including a sensor which detects inclination, such as a gyroscope or an acceleration sensor, is provided to determine the orientation of the computer 7450 (whether the computer is placed horizontally or vertically for a landscape mode or a portrait mode) so that the orientation of the display screen can be automatically changed.

Furthermore, the computer 7450 can be connected to a network. The computer 7450 not only can display information on the Internet but also can be used as a terminal which controls another electronic device connected to the network from a distant place.

Note that this embodiment can be combined with any of the other embodiments in this specification as appropriate.

This application is based on Japanese Patent Application serial no. 2012-155318 filed with Japan Patent Office on Jul. 11, 2012, the entire contents of which are hereby incorporated by reference.

What is claimed is:

1. A liquid crystal display device comprising:
 a transistor including an oxide semiconductor material in a channel formation region; and
 a liquid crystal element including a liquid crystal layer and a pixel electrode electrically connected to a source or a drain of the transistor,
 wherein a minimum value of a capacitance ($C_X+C_{L1}$) of a pixel satisfies a formula (1) and a maximum value of the capacitance ($C_X+C_{L2}$) of the pixel satisfies a formula (2)

$$170 \times 10^{-15}[F] > (C_X+C_{L1}) \qquad (1)$$

$$(C_X+C_{L2}) > 50(C_{L2}-C_{L1}) \qquad (2), \text{ and}$$

wherein, in the formula (1) and the formula (2), $C_{L1}$ represents a minimum value of a capacitance component of the liquid crystal element, $C_{L2}$ represents a maximum value of the capacitance component of the liquid crystal element, ($C_{L2}-C_{L1}$) represents an amount of change in the capacitance component of the liquid crystal element, and $C_X$ represents the capacitance of the pixel from which a capacitance due to the liquid crystal element is subtracted.

2. The liquid crystal display device according to claim 1, wherein the liquid crystal element comprises:
 an insulating layer;
 the pixel electrode in contact with one surface of the insulating layer; and
 a common electrode being in contact with the other surface of the insulating layer and comprising an opening overlapping with the pixel electrode.

3. The liquid crystal display device according to claim 1, wherein an off-state current of the transistor is less than or equal to 100 zA/μm.

4. The liquid crystal display device according to claim 1, wherein the semiconductor material comprises indium and zinc.

5. The liquid crystal display device according to claim 1, wherein the semiconductor material comprises indium, gallium and zinc.

6. The liquid crystal display device according to claim 1, wherein the capacitance of $C_X$ comprises a parasitic capacitance.

7. The liquid crystal display device according to claim 1 further comprising a first substrate,
 wherein the first substrate is provided with the transistor, the pixel electrode and a common electrode.

8. The liquid crystal display device according to claim 7 further comprising a second substrate,
 wherein the liquid crystal layer is provided between the first substrate and the second substrate.

9. The liquid crystal display device according to claim 8, wherein the second substrate is provided with a color filter and a light-blocking layer.

10. A liquid crystal display device comprising:
 a plurality of scan lines extending in a row direction;
 a plurality of signal lines intersecting with the scan lines and extending in a column direction; and
 a pixel in a region surrounded by adjacent scan lines and adjacent signal lines,
 wherein the scan lines are arranged at a density of 300 or more per inch,
 wherein the signal lines are arranged at a density of 300 or more per inch,
 wherein the pixel comprises:
 a transistor including a semiconductor material having a wider band gap and a lower intrinsic carrier density than silicon in a channel formation region, a gate electrically connected to one of the plurality of scan lines, and a source and a drain one of which is electrically connected to one of the plurality of signal lines; and
 a liquid crystal element including a pixel electrode electrically connected to the other of the source and the drain of the transistor, a liquid crystal layer, and a common electrode, and
 wherein a minimum value of a capacitance ($C_X+C_{L1}$) of the pixel satisfies a formula (3) and a maximum value of the capacitance ($C_X+C_{L2}$) of the pixel satisfies a formula (4)

$$170 \times 10^{-15}[F] > (C_X+C_{L1}) \qquad (3)$$

$$(C_X+C_{L2}) > 50(C_{L2}-C_{L1}) \qquad (4), \text{ and}$$

wherein, in the formula (3) and the formula (4), $C_{L1}$ represents a minimum value of a capacitance component of the liquid crystal element, $C_{L2}$ represents a maximum value of the capacitance component of the liquid crystal element, ($C_{L2}-C_{L1}$) represents an amount of change in the capacitance component of the liquid crystal element, and $C_X$ represents the capacitance of the pixel from which a capacitance due to the liquid crystal element is subtracted.

11. The liquid crystal display device according to claim 10, wherein the liquid crystal element comprises:
 an insulating layer;
 the pixel electrode in contact with one surface of the insulating layer; and
 the common electrode being in contact with the other surface of the insulating layer and comprising an opening overlapping with the pixel electrode.

12. The liquid crystal display device according to claim 1, wherein an off-state current of the transistor is less than or equal to 100 zA/μm.

13. The liquid crystal display device according to claim 10, wherein the semiconductor material comprises indium and zinc.

14. The liquid crystal display device according to claim 10, wherein the semiconductor material comprises indium, gallium and zinc.

15. The liquid crystal display device according to claim 10, wherein the capacitance of $C_X$ comprises a parasitic capacitance.

16. The liquid crystal display device according to claim 10 further comprising a first substrate,
    wherein the first substrate is provided with the plurality of scan lines, the plurality of signal lines, the transistor, the pixel electrode and the common electrode.

17. The liquid crystal display device according to claim 16 further comprising a second substrate,
    wherein the liquid crystal layer is provided between the first substrate and the second substrate.

18. The liquid crystal display device according to claim 17, wherein the second substrate is provided with a color filter and a light-blocking layer.

19. A method for driving the liquid crystal display device according to claim 10, comprising:
    a first step of inputting a selection signal to one of the scan lines to select a plurality of pixels electrically connected to the one of the scan lines; and
    a second step of inputting image signals having alternating opposite polarities to a first signal line and a second signal line arranged with a pixel provided therebetween to sequentially write the image signals into the plurality of pixels.

* * * * *